United States Patent
Nakamura et al.

(10) Patent No.: US 8,130,589 B2
(45) Date of Patent: Mar. 6, 2012

(54) SEMICONDUCTOR MEMORY DEVICE USING ONLY SINGLE-CHANNEL TRANSISTOR TO APPLY VOLTAGE TO SELECTED WORD LINE

(75) Inventors: Hiroshi Nakamura, Fujisawa (JP); Kenichi Imamiya, Tokyo (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 13/109,694

(22) Filed: May 17, 2011

(65) Prior Publication Data

US 2011/0216594 A1 Sep. 8, 2011

Related U.S. Application Data

(63) Continuation of application No. 12/856,962, filed on Aug. 16, 2010, now Pat. No. 7,974,148, which is a continuation of application No. 12/504,124, filed on Jul. 16, 2009, now Pat. No. 7,800,973, which is a continuation of application No. 11/858,648, filed on Sep. 20, 2007, now Pat. No. 7,580,285, which is a continuation of application No. 11/374,045, filed on Mar. 14, 2006, now Pat. No. 7,286,402, which is a continuation of application No. 11/115,364, filed on Apr. 27, 2005, now Pat. No. 7,085,162, which is a continuation of application No. 10/607,153, filed on Jun. 27, 2003, now Pat. No. 6,912,157, which is a continuation of application No. 09/875,944, filed on Jun. 8, 2001, now Pat. No. 6,621,735.

(30) Foreign Application Priority Data

Jun. 9, 2000 (JP) .................................. 2000-173715
Oct. 30, 2000 (JP) .................................. 2000-330972

(51) Int. Cl.
*G11C 8/00* (2006.01)
(52) U.S. Cl. ......... 365/230.06; 365/185.11; 365/185.12; 365/185.14; 365/230.03
(58) Field of Classification Search ............. 365/185.11, 365/185.12, 185.14, 230.06, 230.03
See application file for complete search history.

(56) References Cited

U.S. PATENT DOCUMENTS 4,706,218 A   11/1987   Sood
(Continued)

FOREIGN PATENT DOCUMENTS

JP   62-145918 A   6/1987
(Continued)

OTHER PUBLICATIONS

JP Office Action dtd Jul. 24, 2007, JP Appln. 2000-330972.

*Primary Examiner* — Thong Q Le
(74) *Attorney, Agent, or Firm* — Banner & Witcoff, Ltd.

(57) ABSTRACT

A semiconductor memory device has a memory cell array, a first transistor of a first conductivity type, a second transistor of a second conductivity type and a third transistor of the first conductivity type. A source or drain of the first transistor is connected to each of word lines. A drain of the second transistor is connected to a gate of the first transistor. A source of the third transistor is connected to the gate of the first transistor. The gates of the second transistor and the third transistor are not connected, a source of the second transistor is not connected to a drain of the third transistor, and the gate of the second transistor and the drain of the third transistor have different voltage levels corresponding to opposite logic levels each other.

30 Claims, 35 Drawing Sheets

U.S. PATENT DOCUMENTS

| | | |
|---|---|---|
| 5,355,332 A | 10/1994 | Endoh et al. |
| 5,357,462 A | 10/1994 | Tanaka et al. |
| 5,392,253 A | 2/1995 | Atsumi et al. |
| 5,555,204 A | 9/1996 | Endoh et al. |
| 5,615,163 A * | 3/1997 | Sakui et al. .............. 365/230.03 |
| 5,706,241 A | 1/1998 | Nakamura |
| 5,732,018 A | 3/1998 | Choi et al. |
| 5,930,195 A | 7/1999 | Komatsu |
| 6,072,721 A | 6/2000 | Arase |
| 6,166,987 A | 12/2000 | Atsumi et al. |
| 6,249,467 B1 | 6/2001 | Pereira et al. |
| 6,285,591 B1 | 9/2001 | Tanaka et al. |
| 6,353,242 B1 | 3/2002 | Watanabe et al. |
| 6,512,253 B2 | 1/2003 | Watanabe et al. |
| 7,800,973 B2 | 9/2010 | Nakamura et al. |
| 2003/0107055 A1 | 6/2003 | Watanabe et al. |

FOREIGN PATENT DOCUMENTS

| | | |
|---|---|---|
| JP | 09-148913 A | 6/1997 |
| JP | 11-096778 A | 4/1999 |
| JP | 11-250681 A | 9/1999 |
| JP | 2000-163960 A | 6/2000 |

* cited by examiner

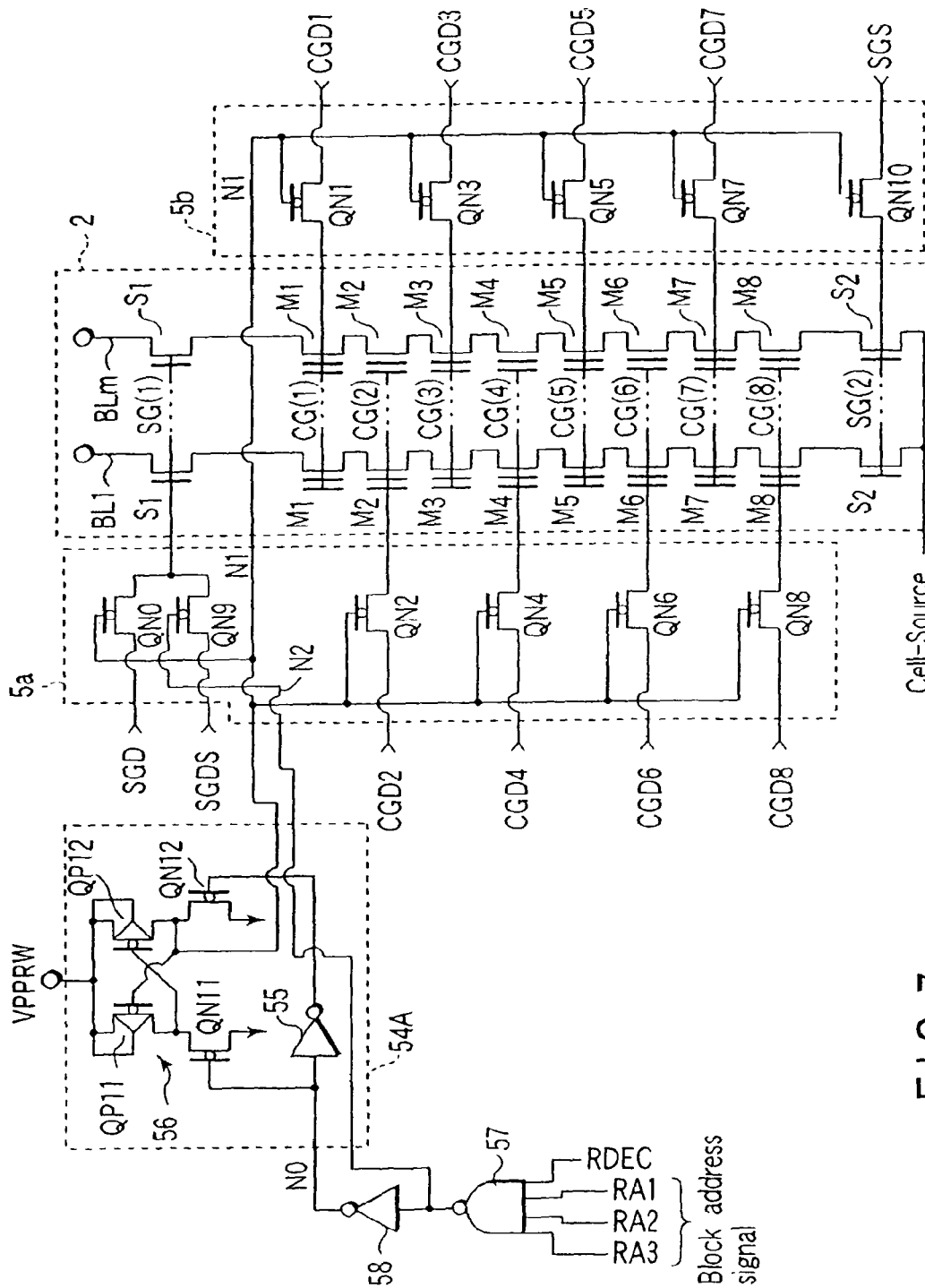
F I G. 7

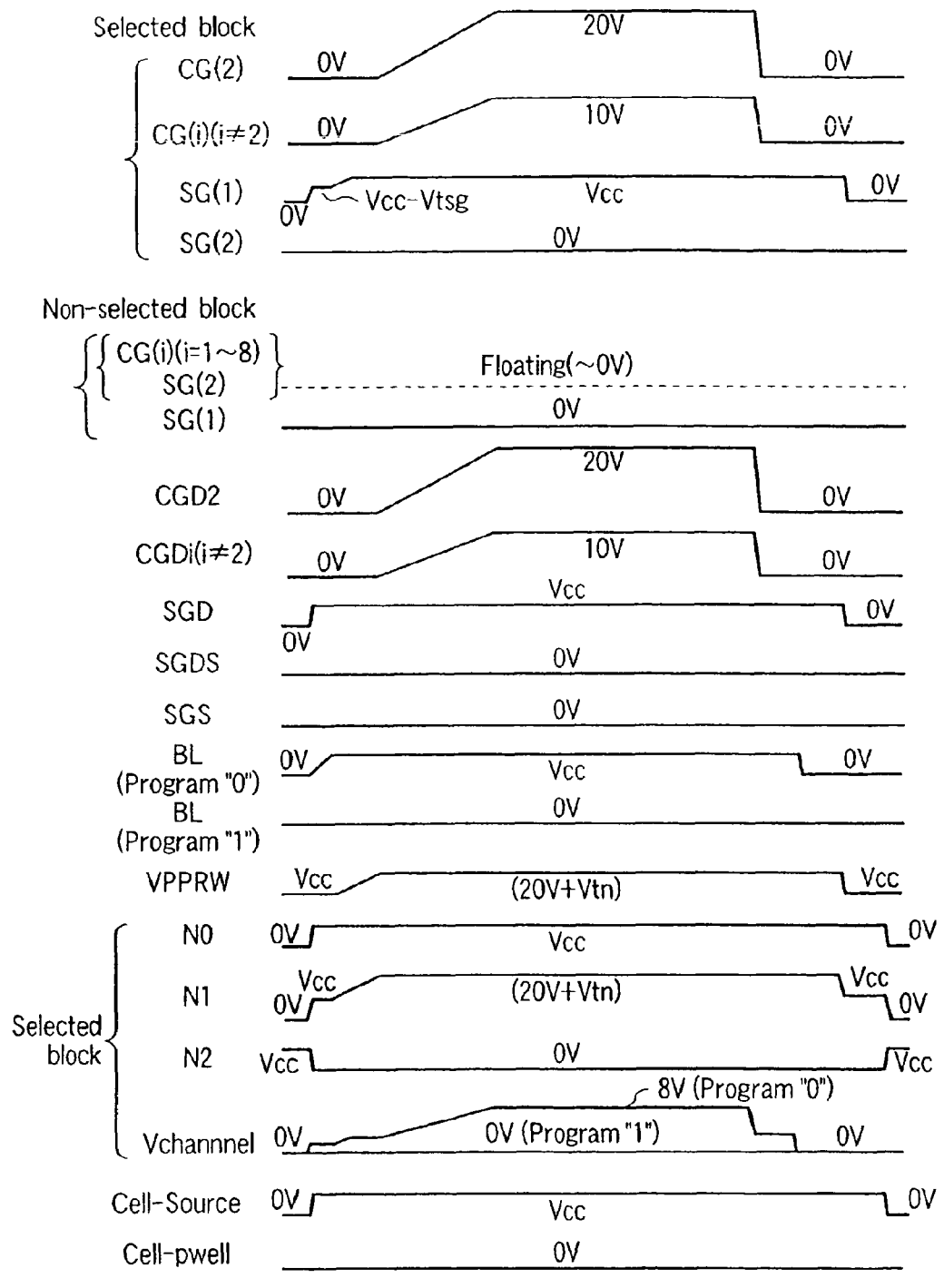
F I G. 8

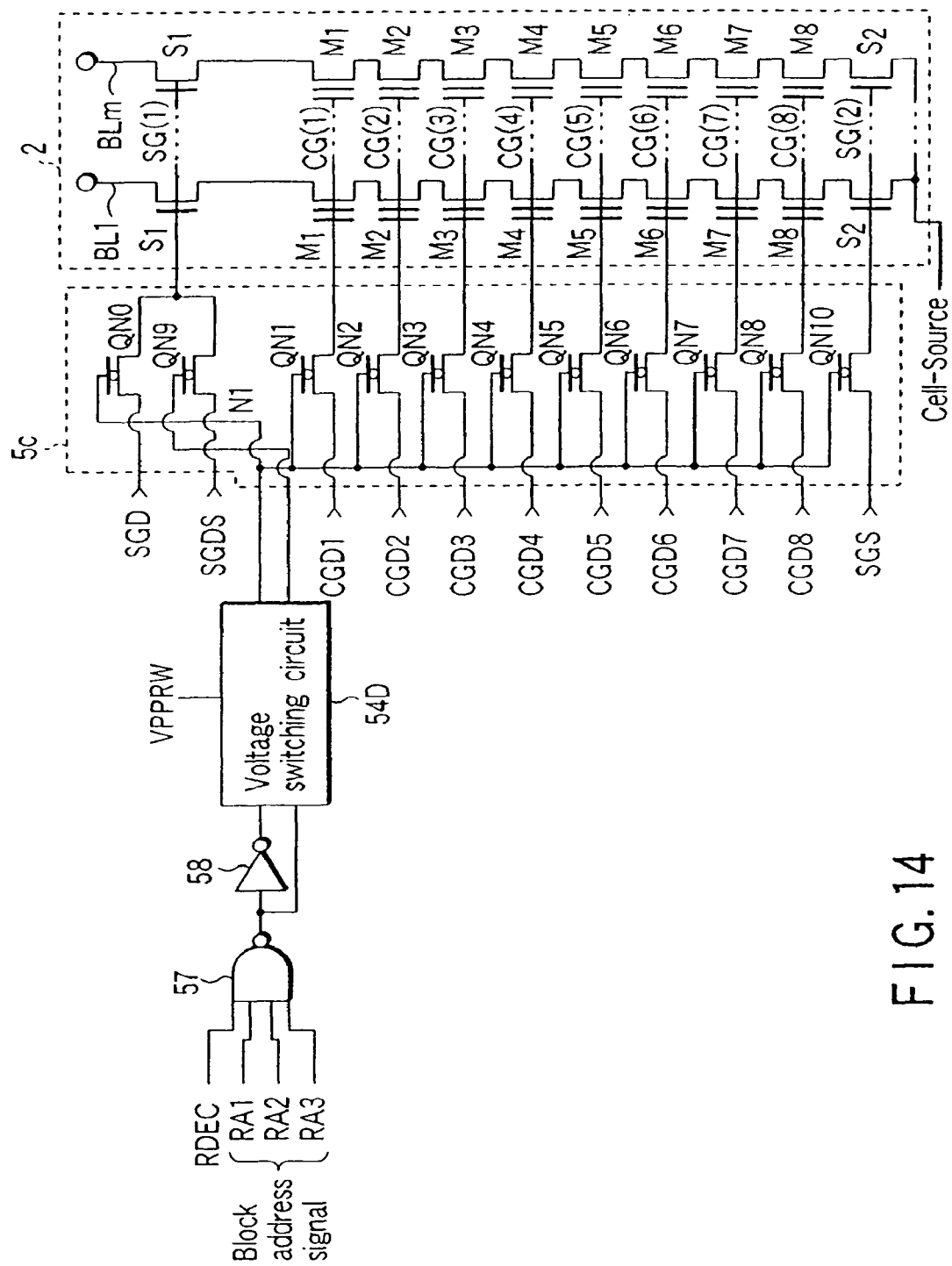
F I G. 14

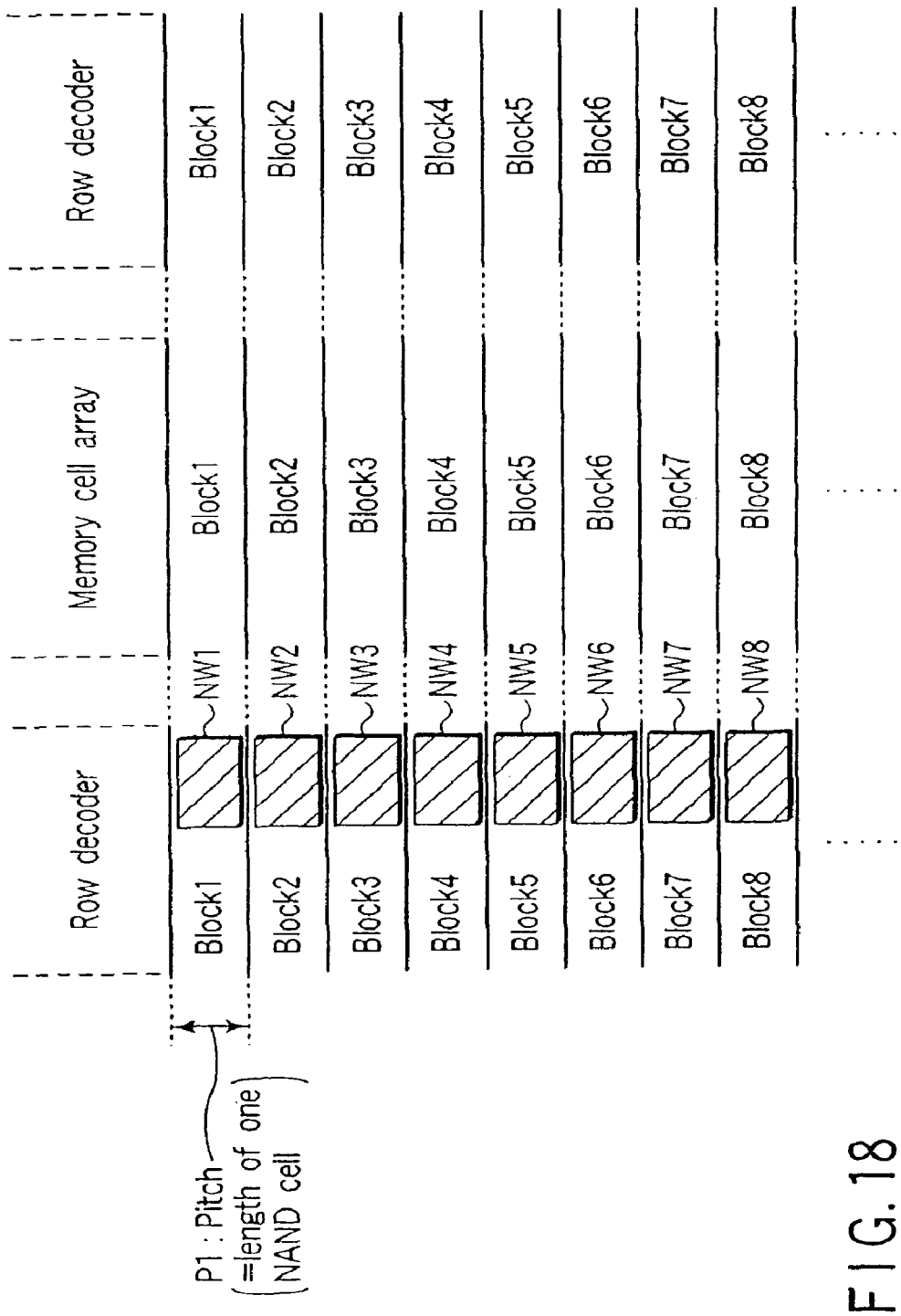
F I G. 18

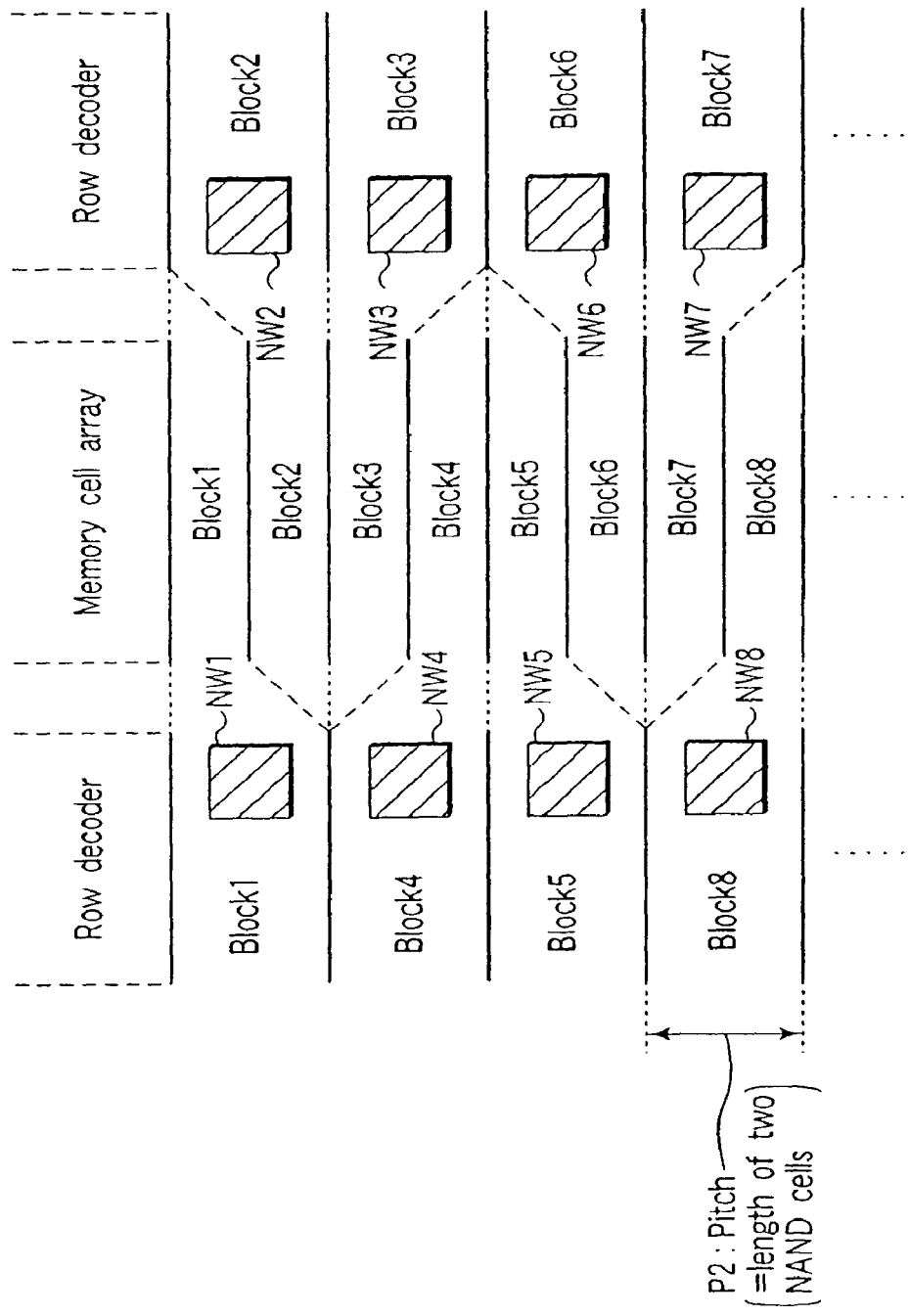
F I G. 19

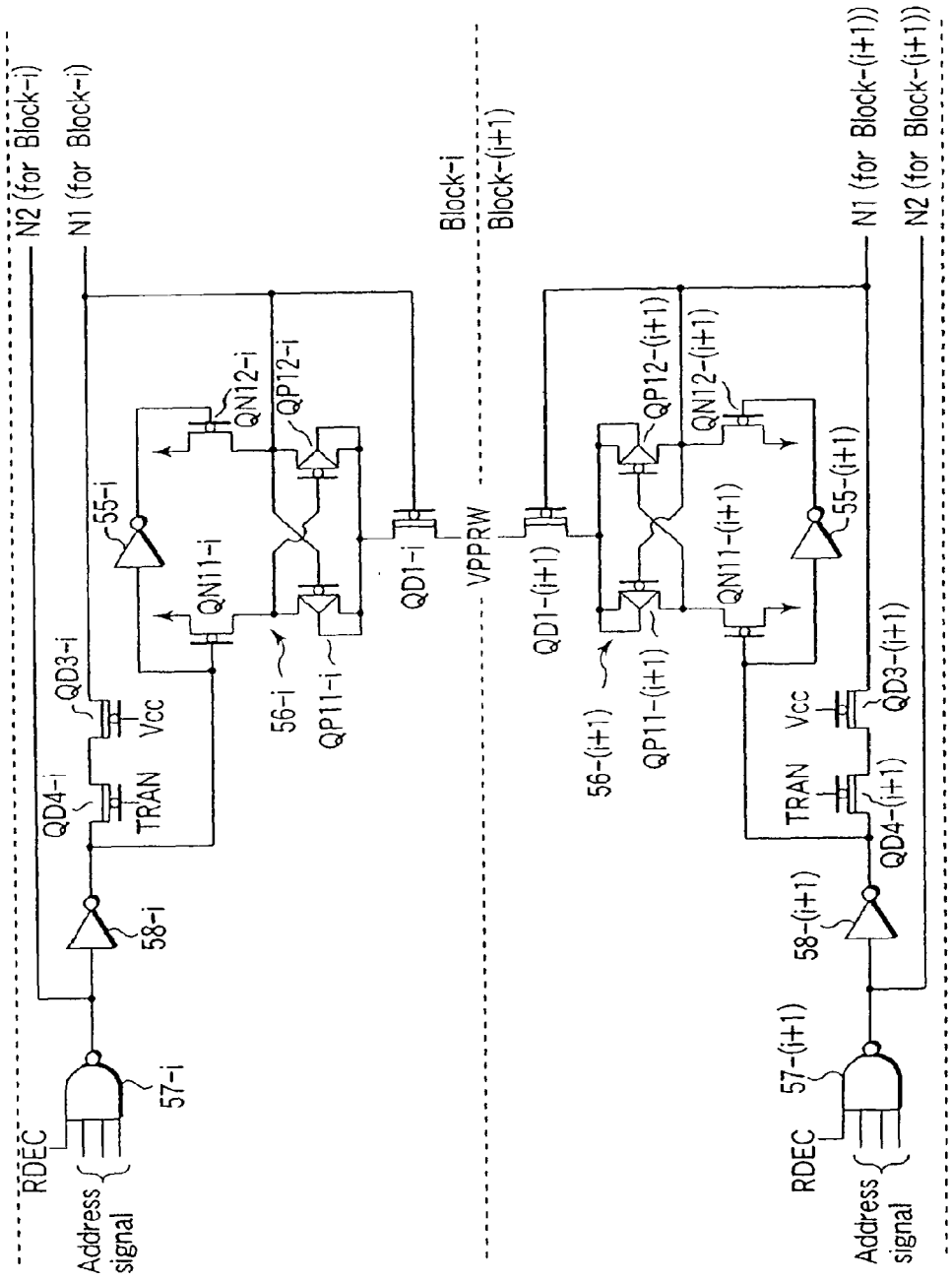
F I G. 22

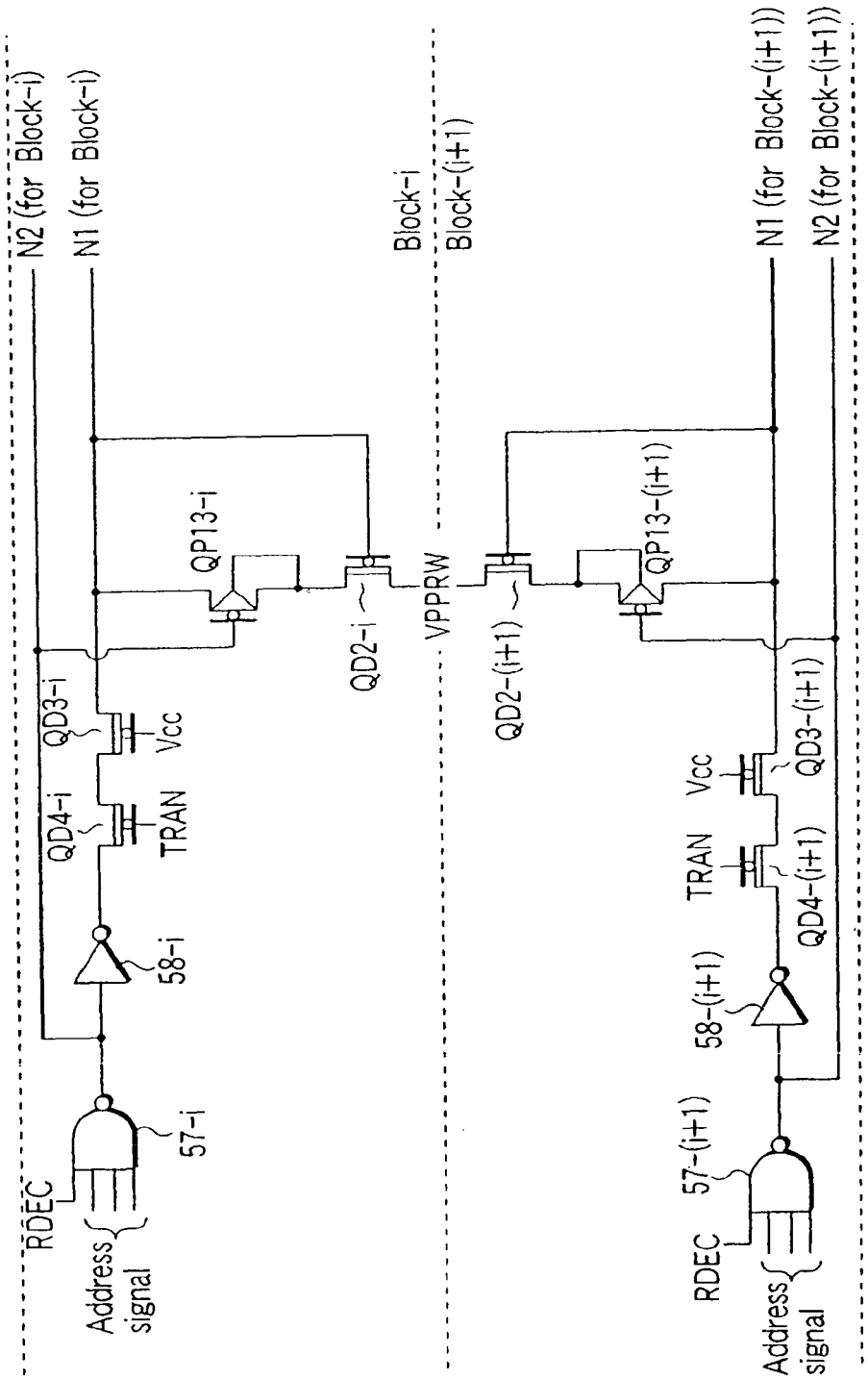
F I G. 23

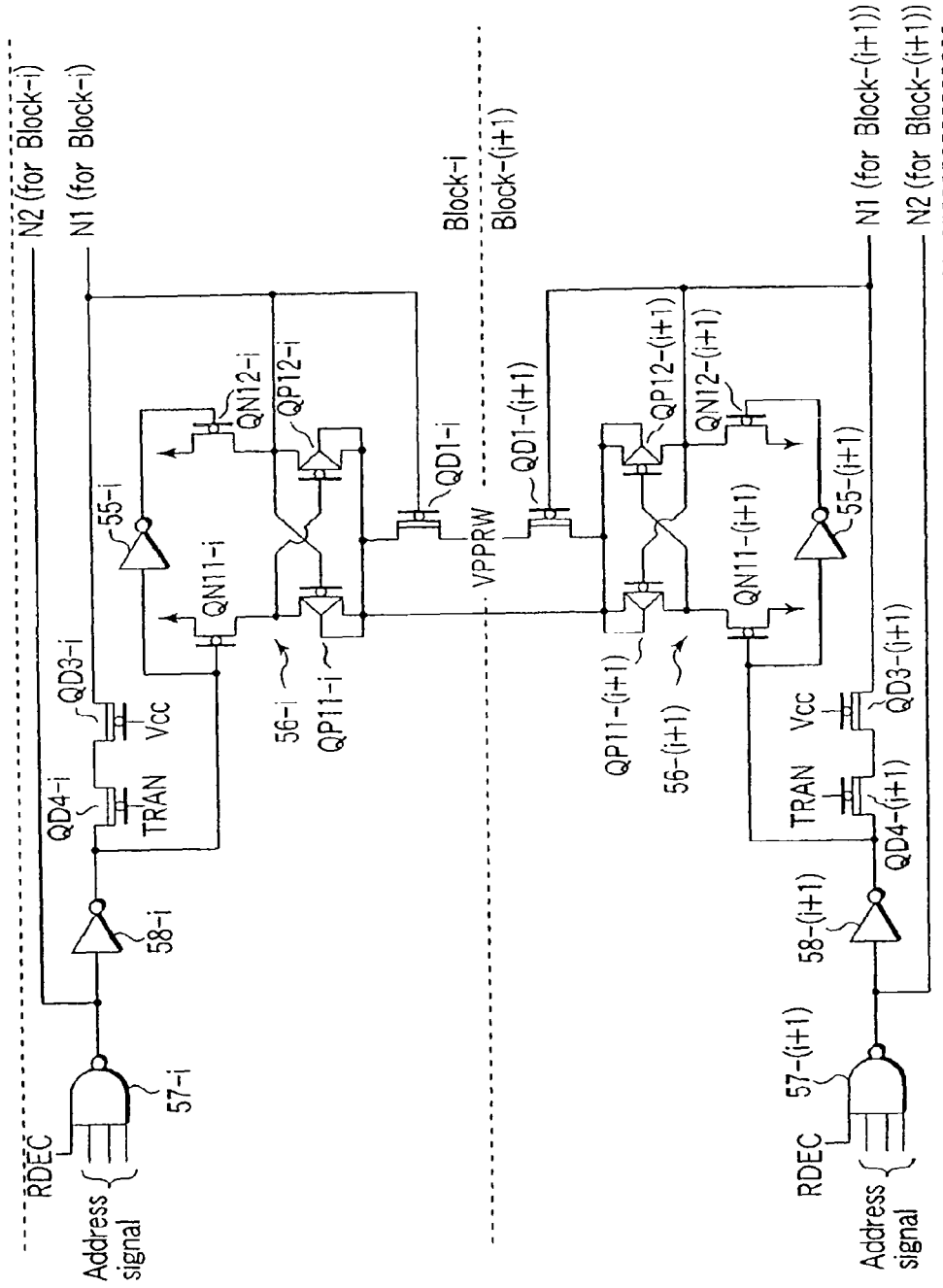
F I G. 24

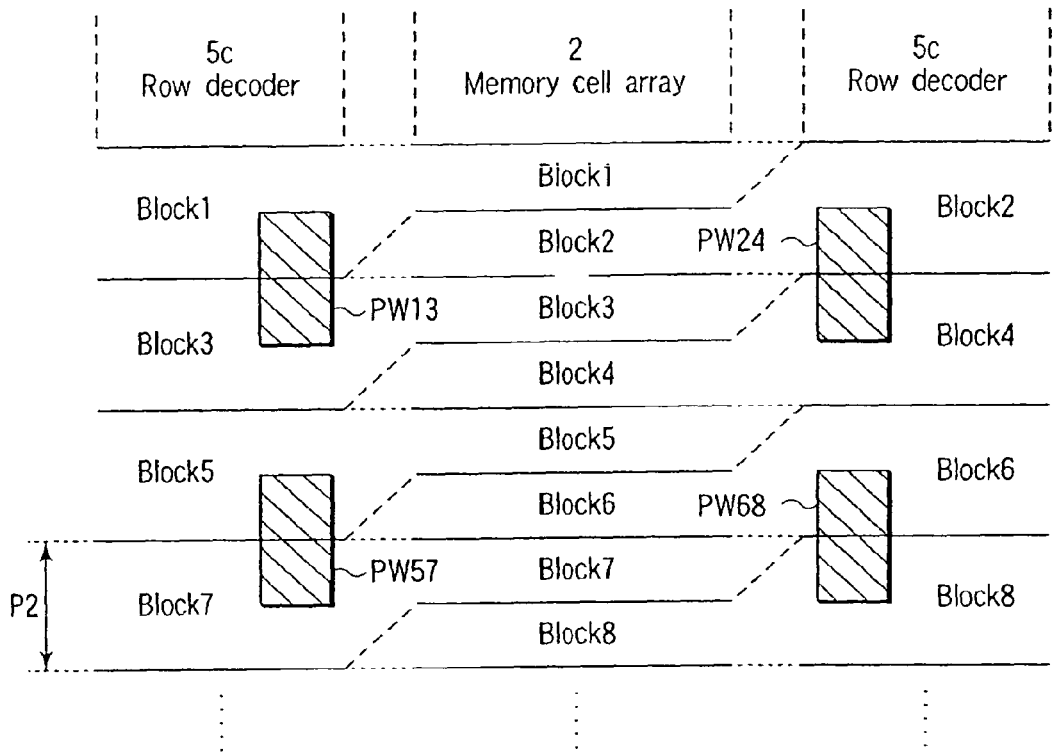
F I G. 28
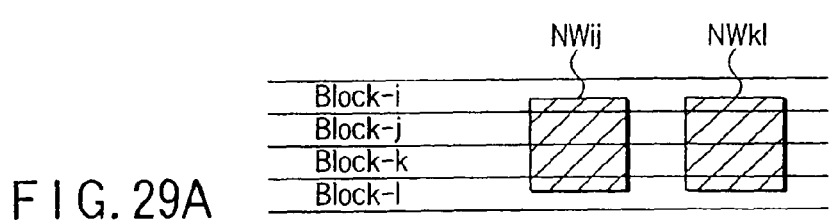
F I G. 29A
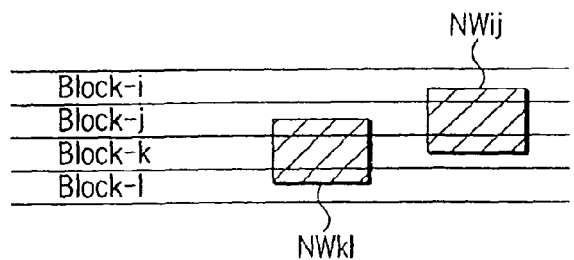
F I G. 29B

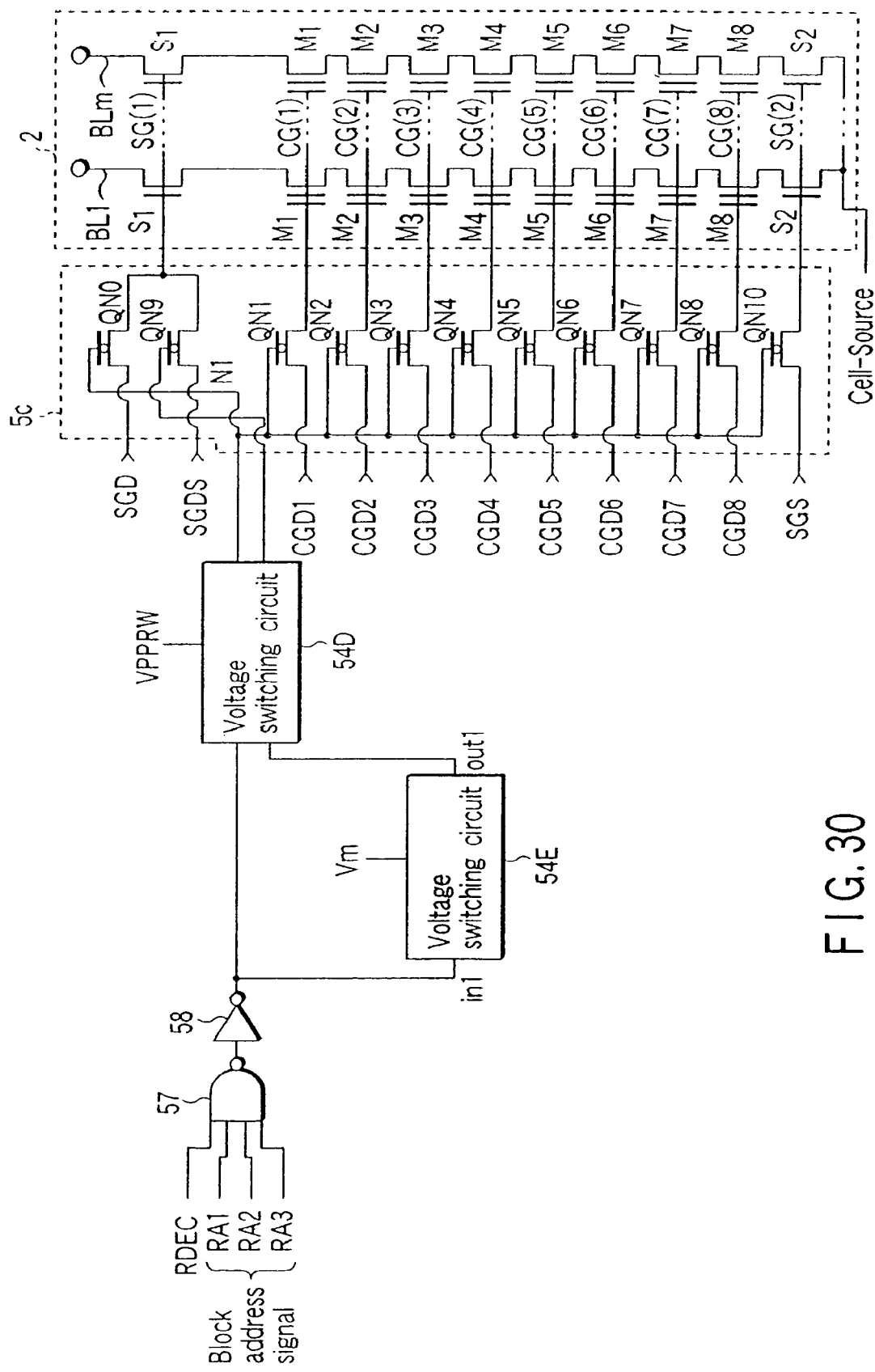
F I G. 30

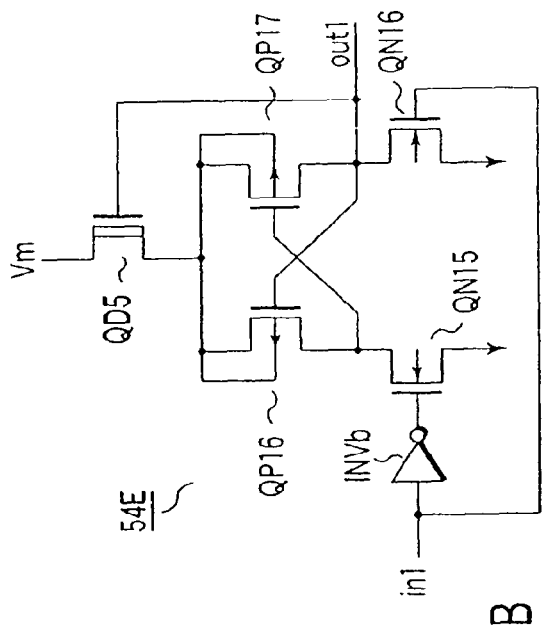
F I G. 31B
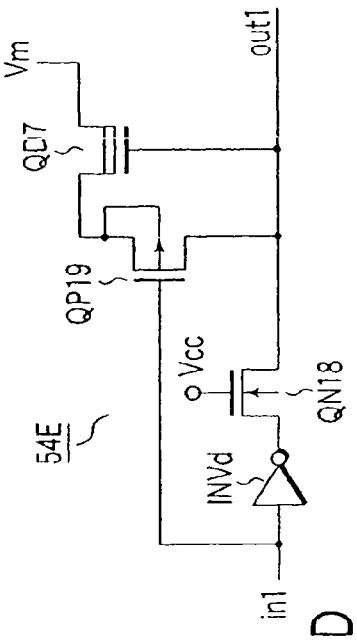
F I G. 31D
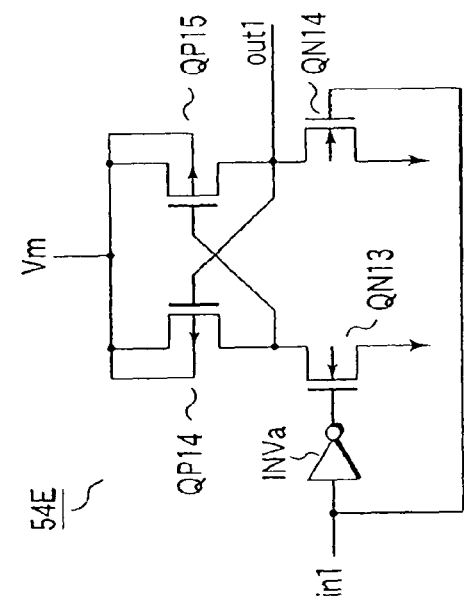
F I G. 31A
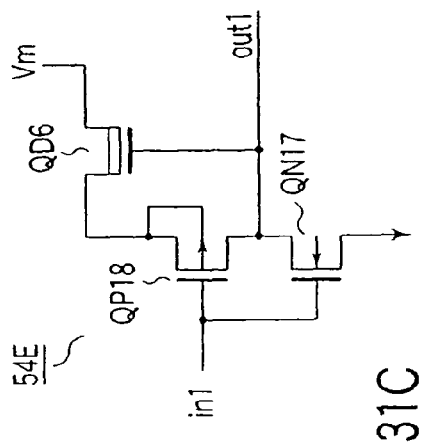
F I G. 31C

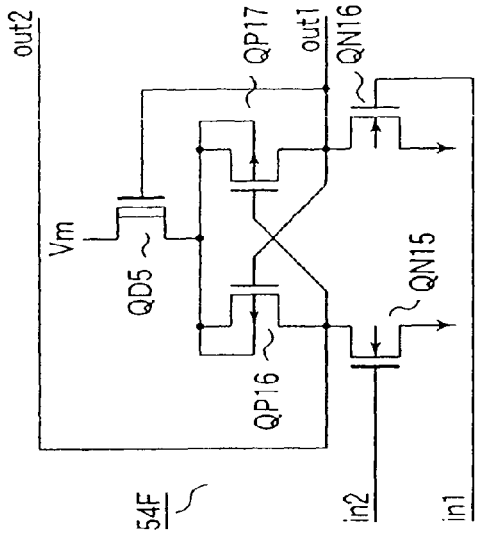
F I G. 33B
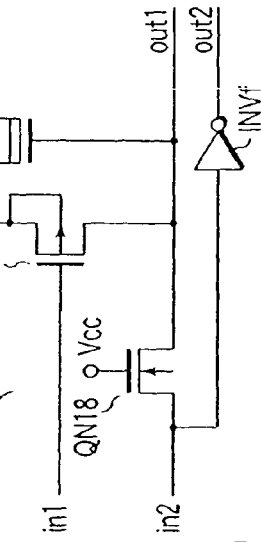
F I G. 33D
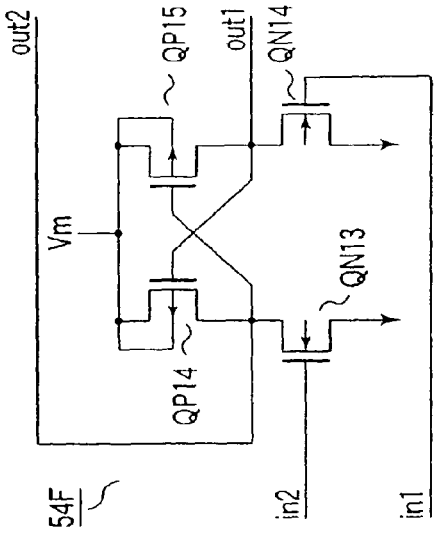
F I G. 33A
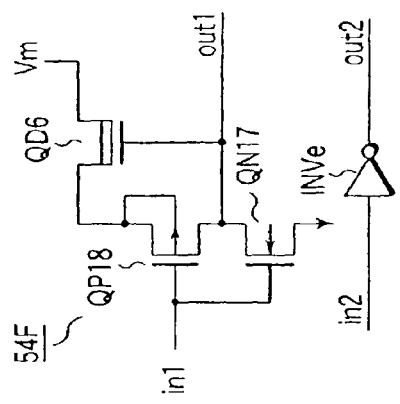
F I G. 33C

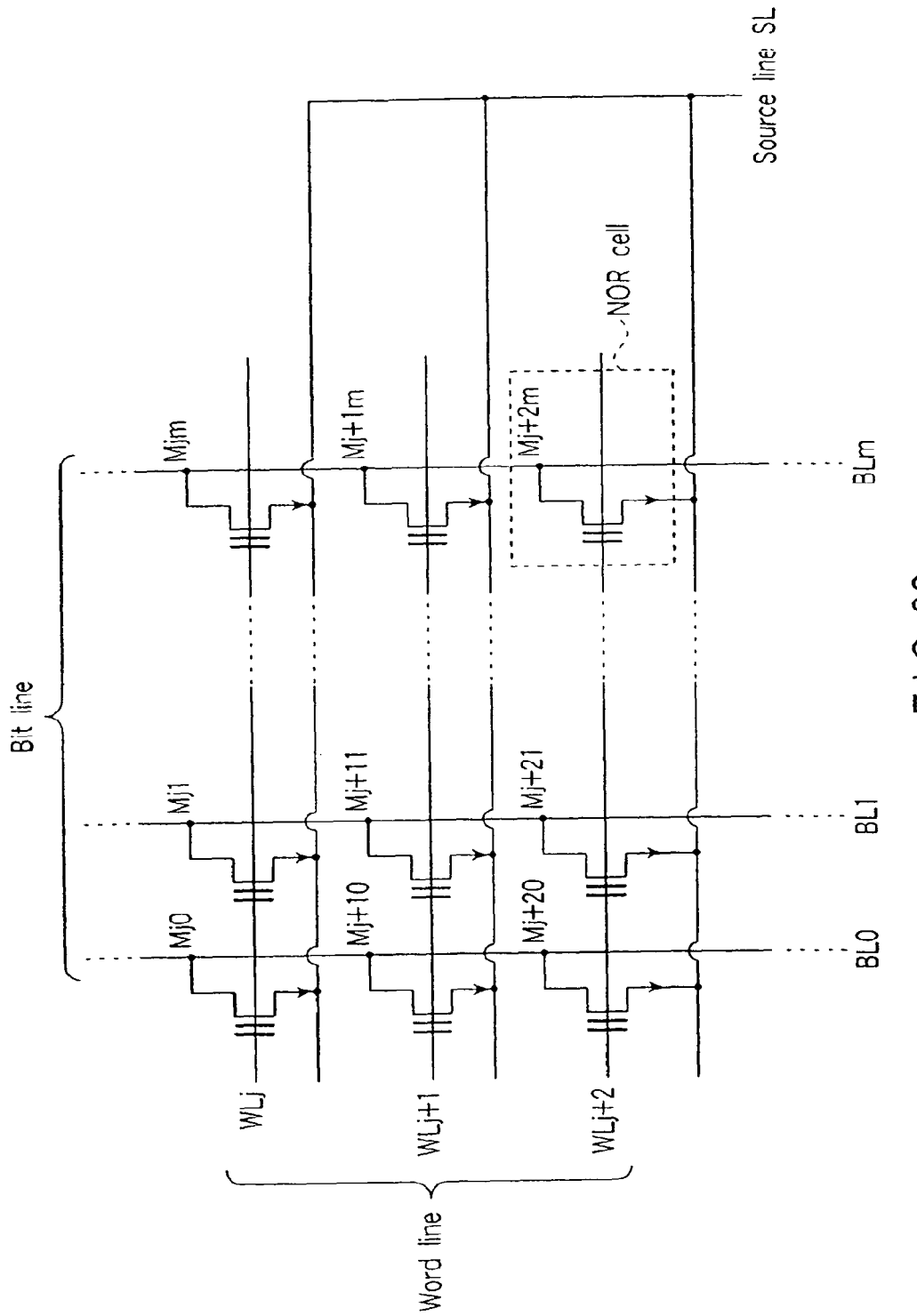
F I G. 36

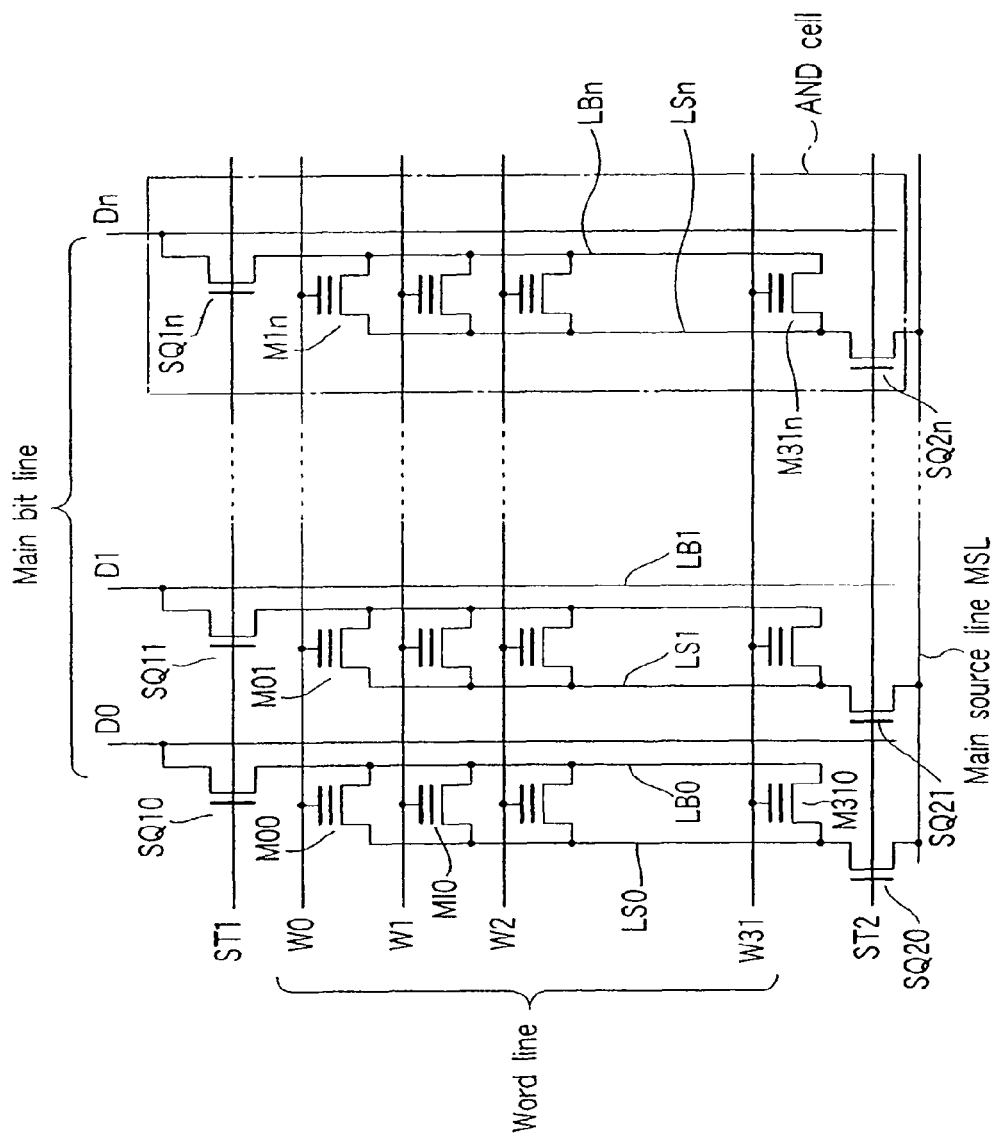
F I G. 38

SEMICONDUCTOR MEMORY DEVICE USING ONLY SINGLE-CHANNEL TRANSISTOR TO APPLY VOLTAGE TO SELECTED WORD LINE

CROSS-REFERENCE TO RELATED APPLICATIONS

This application is a continuation of U.S. application Ser. No. 12/856,962, filed Aug. 16, 2010, now U.S. Pat. No. 7,974,148 which is a continuation of U.S. application Ser. No. 12/504,124, filed Jul. 16, 2009 (now U.S. Pat. No. 7,800,973, issued Sep. 21, 2010), which is a continuation of U.S. application Ser. No. 11/858,648, filed Sep. 20, 2007 (now U.S. Pat. No. 7,580,285, issued Aug. 25, 2009), which is a continuation of prior U.S. application Ser. No. 11/374,045, filed Mar. 14, 2006 (now U.S. Pat. No. 7,286,402, issued Oct. 23, 2007), which is a continuation of prior U.S. application Ser. No. 11/115,364, filed Apr. 27, 2005 (now U.S. Pat. No. 7,085,162, issued Aug. 1, 2006), which is a continuation of prior U.S. application Ser. No. 10/607,153, filed Jun. 27, 2003 (now U.S. Pat. No. 6,912,157, issued Jun. 28, 2005), which is a continuation of prior U.S. application Ser. No. 09/875,944, filed Jun. 8, 2001 (now U.S. Pat. No. 6,621,735, Sep. 16, 2003), which is based upon and claims the benefit of priority from the prior Japanese Patent Applications No. 2000-173715, filed Jun. 9, 2000; and No. 2000-330972, filed Oct. 30, 2000, the entire contents of both of which are incorporated herein by reference.

BACKGROUND OF THE INVENTION

The present invention relates to a semiconductor memory device and, more particularly to, a non-volatile semiconductor memory device such as a NAND cell-, NOR cell-, DINOR cell-, or AND cell-type EEPROM.

Conventionally, an electrically rewritable EEPROM is known as one of the semiconductor memory devices. Among others, a NAND cell-type EEPROM in which each NAND cell block is made up of a plurality of memory cells connected in series is attracting attention as a device that can have a high degree of integration.

Each memory cell of a NAND cell-type EEPROM has a FET-MOS structure in which a floating gate (charge storage layer) and a control gate are stacked with an insulating film there between on a semiconductor substrate. A plurality of adjacent memory cells share sources and drains and are connected in series to thereby make up a NAND cell, which is connected to a bit line as a unit. Such NAND cells are arranged in a matrix, thus constituting a memory array. The memory array is integrally formed in a p-type semiconductor substrate or in a p-type well.

Each drain positioned at one end of the NAND cells connected in series in a column direction of the memory cell array is commonly connected via a select gate transistor to a bit line, while each source positioned at the other end is also connected via a select gate transistor to a common source line. The control gates of the memory transistors and the gate electrode of the select gate transistors are commonly connected respectively as a control gate line (word line) and a select gate line in the row direction of the memory cell array.

This NAND cell-type EEPROM operates as follows. Data programming operations mainly start from a memory cell which is the most remote from the bit line contact. First, when the data programming operation starts, according to write-in data, the bit line is given 0V (for "1" data write-in bit line) or a power supply voltage Vcc (for "0" data write-in bit line) and the select gate line on the side of a selected bit line contact is given Vcc. In this case, in a selected NAND cell connected to the "1" data write-in bit line, its channel portion is fixed to 0V by way of a select gate transistor. In a selected NAND cell connected to the "0" data write-in bit line, on the other hand, its channel portion is charged via the select gate transistor up to [Vcc−Vtsg] (where Vtsg is a threshold voltage of the select gate transistor) and then enters a floating state. Subsequently, one control gate line in the selected memory cell in the selected NAND cell changes in potential from 0V to Vpp (=20V or so, which is a programming high voltage), while the other control gate line in the selected NAND cell changes in potential from 0V to Vmg (=10V or so, which is an intermediate voltage).

Since a selected NAND cell connected to the "1" data write-in bit line has its channel portion fixed at 0V, it has a large potential difference (=20V or so) between its selected memory cell's control gate line (=Vpp potential) and its channel portion (=0V), thus causing electrons to be injected from the channel portion to the floating gate. Accordingly, the threshold voltage of that selected memory cell shifts to the positive direction, thus completing write-in of data "1".

A selected NAND cell connected to the "0" data write-in bit line, on the other hand, has its channel portion in a floating state, so that an influence of capacitive coupling between its control gate line and its channel portion raises a voltage of the control gate line (0V→Vpp, Vmg), which in turn raises a potential of the channel portion from a [Vcc−Vtsg] potential to Vmch (=8V or so) with that channel portion as held in the floating state. In this case, since a potential difference between the control gate line (=Vpp potential) and the channel portion (=Vmch) of the selected memory cell in the selected NAND cell is a relatively low value of 12V or so, thus electron injection is avoided. Therefore, the threshold voltage of the selected memory cell is held unchanged at a negative value.

Data erase is carried out to all of the memory cells in a selected NAND cell block. That is, 0V is applied to all the control gate lines of the selected NAND cell block, while a high voltage of 20V or so is applied to the bit lines, the source lines, the p-type well regions (or p-type semiconductor substrate), and the control gate lines and all the select gate lines in the non-selected NAND cell blocks. Thus, in all the memory cells in the selected NAND cell block, the electrons in the floating gate are emitted to the p-type well (or the p-type semiconductor substrate), thus shifting the threshold voltage to the negative direction.

Data read-out, on the other hand, is carried out by applying 0V to the control gate line of a selected memory cell and a read-out intermediate voltage Vread (4V or so) to the control gate line and the select gate line of the other memory cells to thereby detect whether current flows through that selected memory cell.

As may be obvious from the above description, to write data into a NAND cell-type EEPROM, it is necessary to apply voltages higher than the power supply voltage, i.e. Vpp (20V or so) to a selected control gate line in a selected block and Vmg (10V or so) to a non-selected control gate line in that selected block.

To apply the above-mentioned voltages Vpp and Vmg, in a row decoder circuit, the current paths of two kinds of elements of an NMOS transistor (n-channel type MOS transistor) and a PMOS transistor (p-channel type MOS transistor) having different polarities are connected in parallel to the control gate line to conduct control so that both transistors may be turned ON and OFF in a selected block and in a non-selected block respectively.

FIG. 1 is a circuit diagram for showing a configuration example of part of the row decoder circuit in such a conventional semiconductor memory device.

In the circuit shown in FIG. 1, connected to each control gate line are one NMOS transistor (Qn1 to Qn8)+one PMOS transistor (Qp1 to Qp8). Those transistors Qn1 to Qn8 and Qp1 to Qp8 are supplied with complementary control signals from nodes N1 and N2 respectively.

For data write-in, the power supply node VPPRW and a selected control gate line have the same level in voltage like power supply node VPPRW=[selected control gate line voltage]=20V. In this case, connected to each control gate line are one NMOS transistor+one PMOS transistor, so that 20V can be applied to the control gate line even when the power supply node VPPRW is 20V. Accordingly, it is not necessary to raise the power supply node VPPRW to (20V+Vtn) in order to apply both voltages of 0V and Vpp in a selected block.

Note here that in the circuit shown in FIG. 1, memory cells M1 to M8 have their current paths connected in series, thus making up one NAND cell. One end of the each NAND cell is connected via the current path of the select gate transistor S1 to the bit lines BL1 to BLm and the other end, via the current path of the select gate transistor S2 to the source line (Cell-Source) commonly. The control gate lines CG(1) to CG(8) are commonly connected to the control gates of the memory cells M1 to M8 respectively in each NAND cell, while the select gate lines SG(1) and SG(2) are commonly connected to the gates of the select gate transistors S1 and S2 respectively. The signal input nodes CGD1 to CGD8, SGD, SGS, and SGDS are each supplied with a decode signal. Moreover, the row decoder activating signal RDEC is at Vcc during general data programming, read-out, and erase and at 0V during non-operation. The block address signal RA1, RA2, and RA3 are all at Vcc in a selected block and at least one of them is at 0V in the non-selected blocks.

All the PMOS transistors arranged in a region HV indicated by a broken line in the figure are formed in the n-well region to which the programming high voltage Vpp is applied, so that either of the nodes N1 and N2 is always at Vpp during write-in. Furthermore, the node SGDS is at 0V during write-in.

By the above-mentioned configuration, however, each of the control gate lines CG(1) to CG(8) requires two transistors Qp1 to Qp8, Qn1 to Qn8 to thereby increase the number of elements hence a pattern occupied area in the row decoder circuit, thus problematically raising the chip cost.

To prevent an increase in the number of the elements in the row decoder circuit, on the other hand, such a circuit as shown in FIG. 2 may be used in which one transistor (e.g., only NMOS transistor QN1 to QN8) is connected to each control gate line. The circuit shown in FIG. 2 has almost the same configuration of a memory block 2 as that of FIG. 1 but is different therefrom in the circuit configuration of parts 5a and 5b of the row decoder circuit (control gate lines CG(1) to CG(8) and a transistor portion for applying voltages to the select gate transistors S1 and S2 and in that a pump circuit PUMP is provided.

In a case of this circuit configuration, to apply the programming high voltage Vpp to the control gate lines CG(1) to CG(8), it is necessary to apply [VPP+Vtn] to the gates of the NMOS transistors QN1 to QN8 connected to these control gate lines CG(1) to CG(8), where Vtn is a threshold voltage of the NMOS transistors QN1 to QN8 connected to the control gate lines CG(1) to CG(8). Therefore, the pump circuit PUMP is provided in the row decoder circuit.

This pump circuit PUMP comprises capacitors C1 and C2, NMOS transistors QN21 to QN23, an inverter 6, a NAND gate 7, and depletion-type NMOS transistors QN24 and QN25.

In the circuit shown in FIG. 2, a signal OSCRD acts as an oscillation signal during data write-in and read-out, so that a voltage raised in the pump circuit PUMP is output to a node N1 and applied along the current paths of the transistors QN1 to QN8 to the control gate lines CG(1) to CG(8). A signal TRAN is constantly set at 0V.

The above-mentioned pump circuit PUMP has the plurality of capacitors C1 and C2 and so has a large area. Those two capacitors C1 and C2, in particular, usually occupy a larger pattern area than any other elements, thus leading to a problem that the pattern area of the row decoder circuit cannot sufficiently be reduced although the number of the transistors required for applying voltage can be decreased.

Thus, the conventional NAND cell-type EEPROM needs to provide a function for sending a high voltage to the word lines to thus require a plurality of transistors to each word line in the row decoder circuit. This leads to a problem of an increase in the pattern area of the row decoder circuit.

If, to solve this problem, one transistor is connected to each word line in the row decoder circuit, the row decoder circuit needs to have a pump circuit therein, a large pattern area of which pump circuit still increases the pattern area of the row decoder circuit.

Further, if the row decoder has one transistor connected to each word line and has no pump circuit therein, the programming high voltage cannot be applied to the word lines without a drop in potential, thus giving rise to a risk that data may not securely written in.

BRIEF SUMMARY OF THE INVENTION

According to an aspect of the present invention, there is provided a semiconductor memory device comprising a semiconductor memory device comprising:

a memory cell array in which memory cells are arranged in a matrix including a plurality of word lines;

a first transistor of a first conductivity type, a source or drain of the first transistor being connected to each of the word lines;

a second transistor of a second conductivity type, opposite to the first conductivity type, a drain of the second transistor being connected to a gate of the first transistor; and a third transistor of the first conductivity type, a source of the third transistor being connected to the gate of the first transistor, wherein gates of the second transistor and the third transistor are not connected, a source of the second transistor is not connected to a drain of the third transistor, and the gate of the second transistor and the drain of the third transistor have different voltage levels corresponding to opposite logic levels each other.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram for showing a configuration example of a row decoder circuit and part of a memory cell array in a semiconductor memory device according to a first embodiment of the present invention;

FIG. 8 is a timing chart for showing a data programming operation in the semiconductor memory device according to the first embodiment of the present invention;

FIG. 14 is a circuit diagram for showing a configuration example of a row decoder and part of a memory cell array in a semiconductor memory device according to a fourth embodiment of the present invention;

FIG. 18 is an illustration for showing a first example of the block arrangement of the memory cell array and the row decoder and the shape of the n-well region in the semiconductor memory device according to the embodiment of the present invention;

FIG. 19 is an illustration for showing a second example of the block arrangement of the memory cell array and the row decoder and the shape of the n-well region in the semiconductor memory device according to the embodiment of the present invention;

FIG. 22 shows circuit diagrams for illustrating a first configuration of the row decoder circuit in the block address decoder portion and the voltage switching circuit in the semiconductor devices according to the first through fourth embodiments and many other embodiments of the present invention;

FIG. 23 shows circuit diagrams for illustrating a second configuration of the row decoder circuit in the block address decoder portion and the voltage switching circuit in the semiconductor devices according to the first through fourth embodiments and many other embodiments of the present invention;

FIG. 24 shows circuit diagrams for illustrating a third configuration of the row decoder circuit in the block address decoder portion and the voltage switching circuit in the semiconductor devices according to the first through fourth embodiments and many other embodiments of the present invention;

FIG. 28 is an illustration for explaining the row decoder circuit block arrangement and the n-well region shape in the semiconductor memory device according to many other embodiments;

FIGS. 29A and 29B are illustrations for explaining the row decoder circuit block arrangement and the n-well region shape in the semiconductor memory device according to many other embodiments;

FIG. 30 is a circuit diagram for showing another configuration example of the row decoder circuit in the semiconductor memory device according to a fifth embodiment of the present invention;

FIGS. 31A to 31D are circuit diagrams for showing specific configuration examples of the voltage switching circuit in the circuit shown in FIG. 30;

FIGS. 33A to 33D are circuit diagrams for showing specific configuration examples of the voltage switching circuit in the circuit shown in FIG. 32;

FIG. 36 is an equivalent circuit diagram for showing a memory cell array in a NOR cell-type EEPROM;

FIG. 38 is an equivalent circuit diagram for showing a memory cell array in an AND cell-type EEPROM.

DETAILED DESCRIPTION OF THE INVENTION

Figure 1:
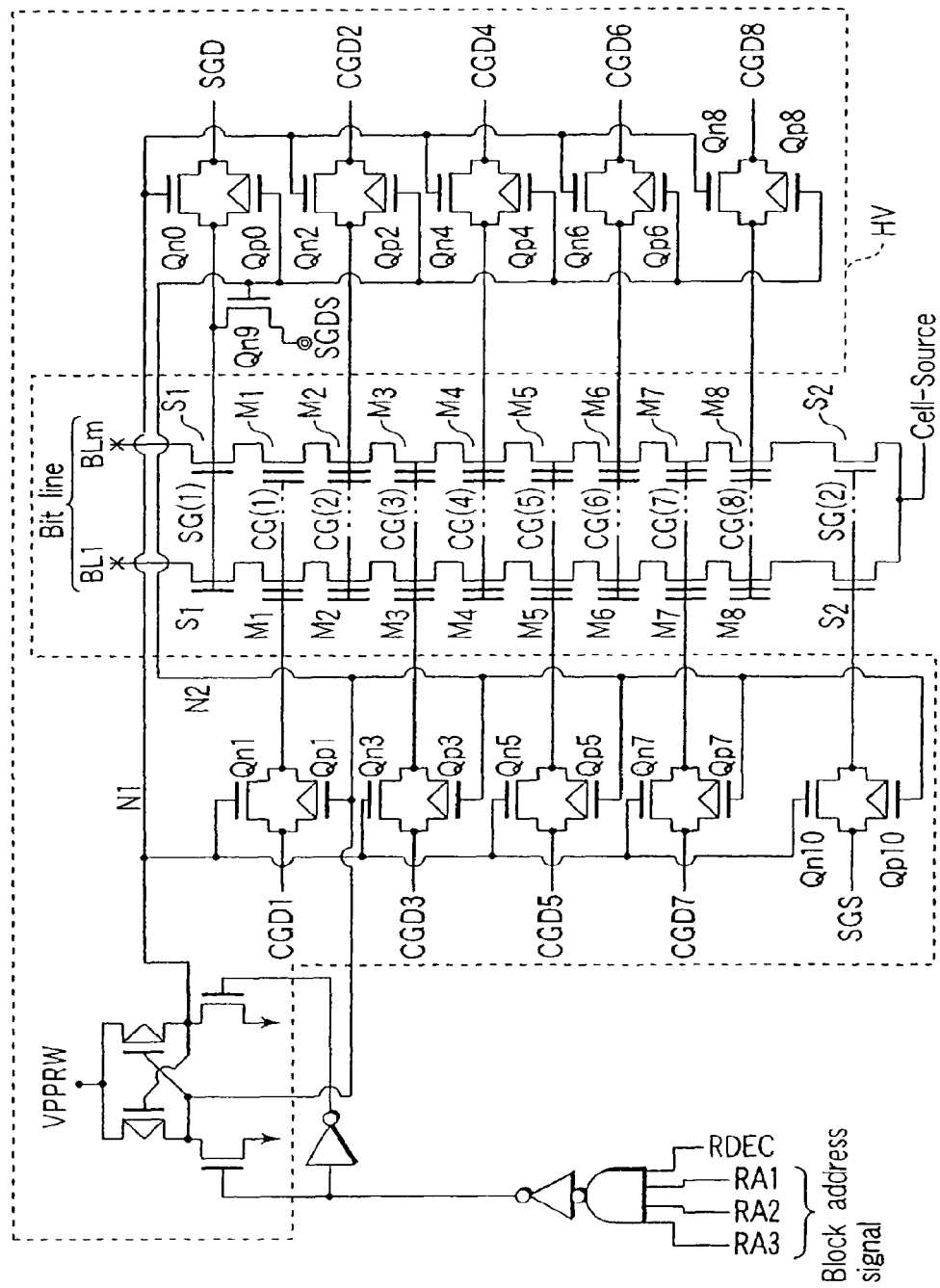
FIG. 1 is a circuit diagram for showing a configuration example of a row decoder circuit and part of a memory cell array in a conventional semiconductor memory device.
Figure 2:
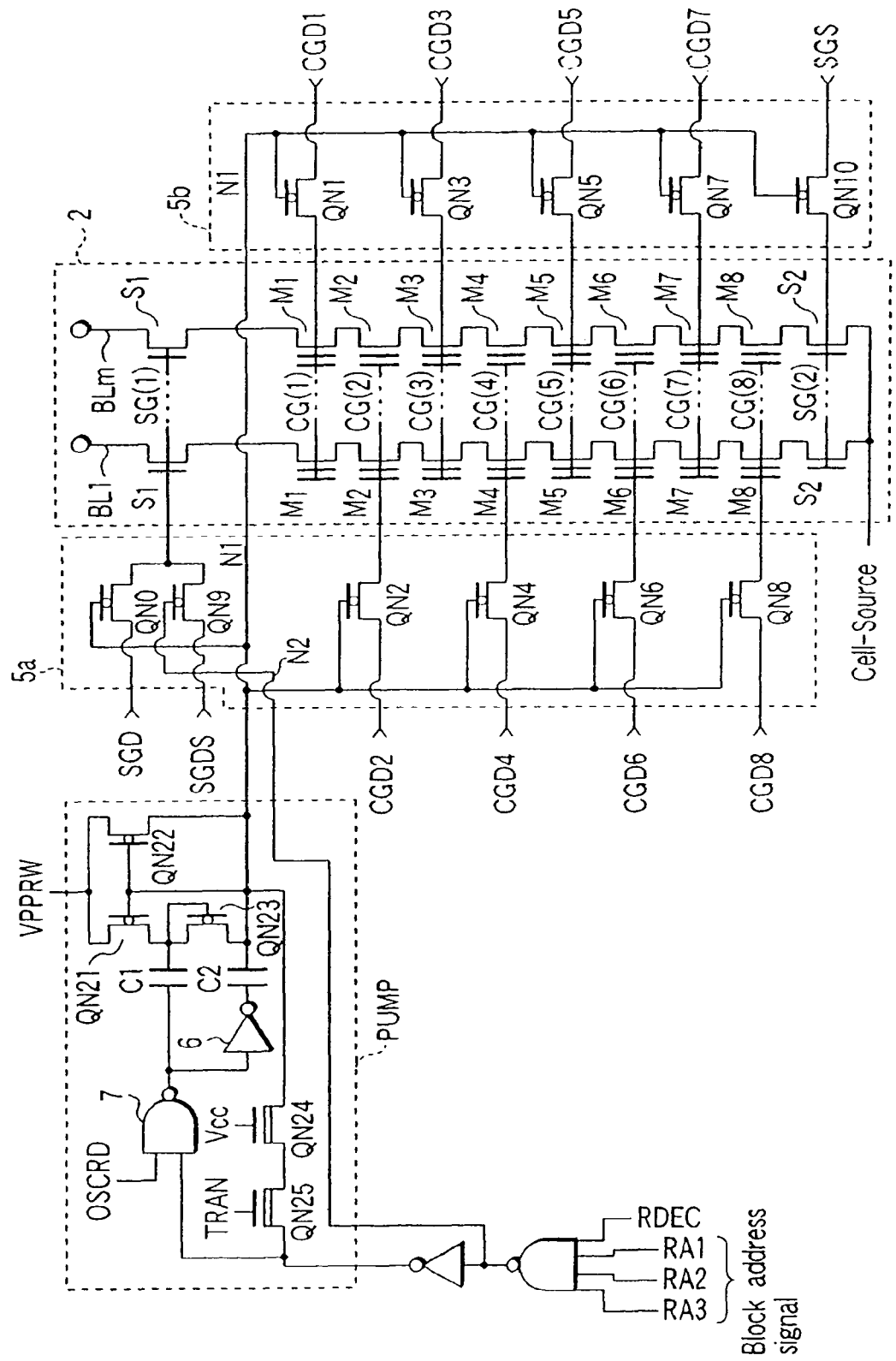
FIG. 2 is a circuit diagram for showing another configuration example of the row decoder circuit and part of the memory cell array in the conventional semiconductor memory device.
Figure 3:
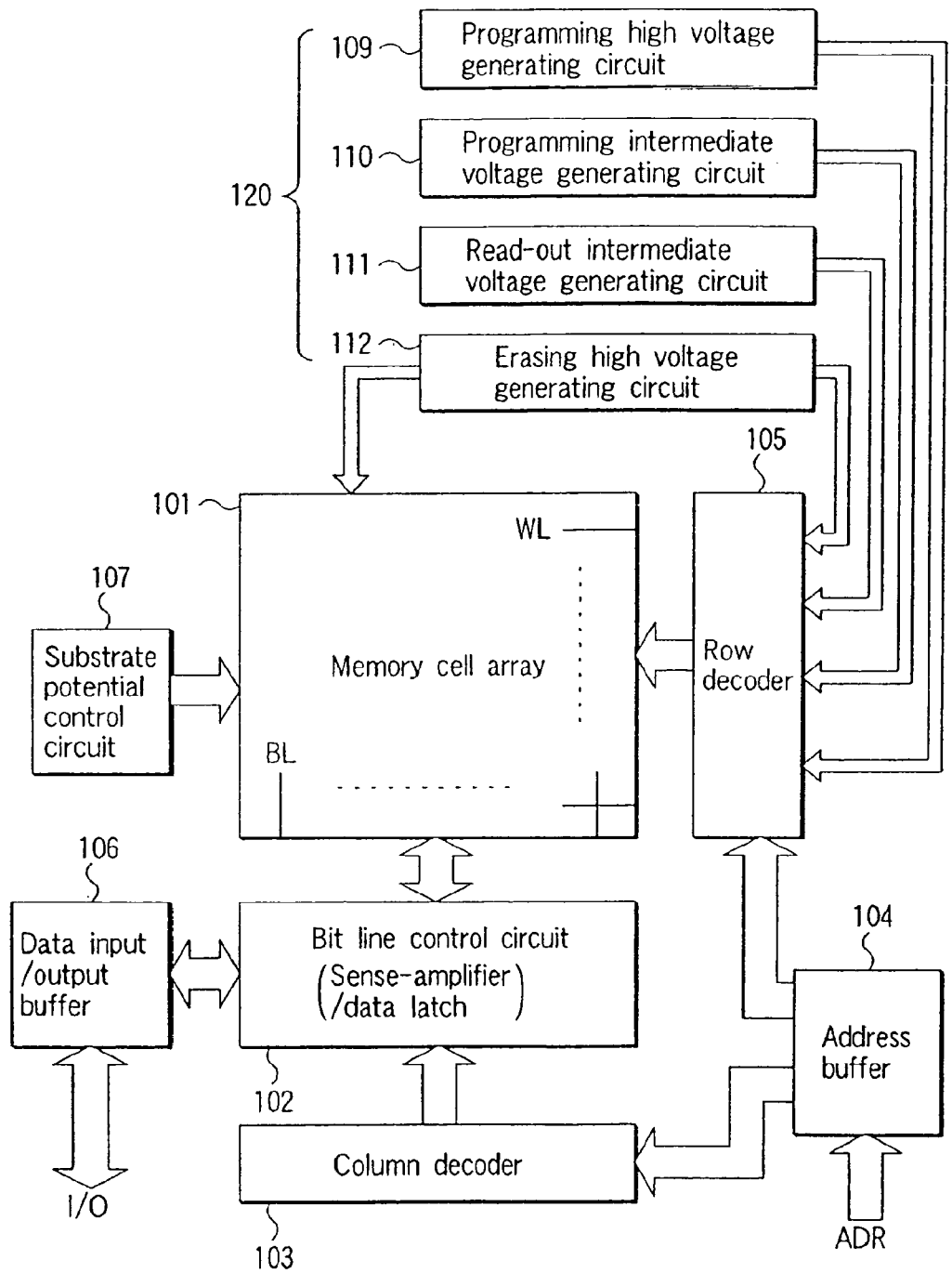
FIG. 3 is a block diagram for showing a schematic configuration of a NAND cell-type EEPROM, intended to explain a semiconductor memory device according to an embodiment of the present invention.

FIG. 3 is a block diagram for showing a schematic configuration of a NAND cell-type EEPROM, intended to explain a semiconductor memory device according to an embodiment of the present invention. To a memory cell array 101 is connected a bit line control circuit (sense-amplifier/data latch) 102 for data write-in, read-out, re-write-in, and verify read-out. This bit line control circuit 102 is connected to a data input/output buffer 106 to thereby receive as an input an output of a column decoder 103 for receiving an address signal from an address buffer 104.

Furthermore, to the above-mentioned memory cell array 101 is connected a substrate potential control circuit 107 for controlling a potential of a p-type silicon substrate (or p-type well region) in which this memory cell array 101 is formed. In addition, a programming high voltage generating circuit 109 and a programming intermediate voltage generating circuit 110 are provided for generating the programming high voltage Vpp (20V or so) and the intermediate voltage Vmg (10V or so) respectively during a data programming operation. Further, a read-out intermediate generating circuit 111 is provided for generating the read-out intermediate voltage Vread during a data read-out operation. Moreover, an erasing high voltage generating circuit 112 is provided for generating the erase high voltage Vpp (20V or so) during an erase operation.

The bit line control circuit 102 is mainly made up of CMOS flip-flops, thus carrying out a sense operation for latching write-in data or reading a bit line potential, a sense operation for verify reading after a programming operation, and latching re-write-in data.

Figure 4A:
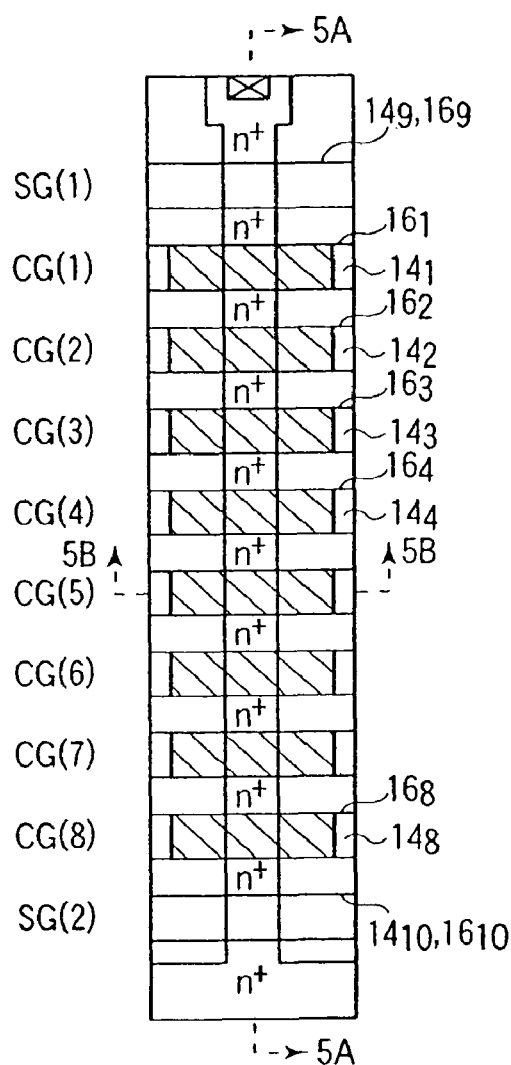
FIG. 4A is a plan view for showing a pattern of one NAND cell portion in the memory cell array of FIG. 3.
Figure 4B:
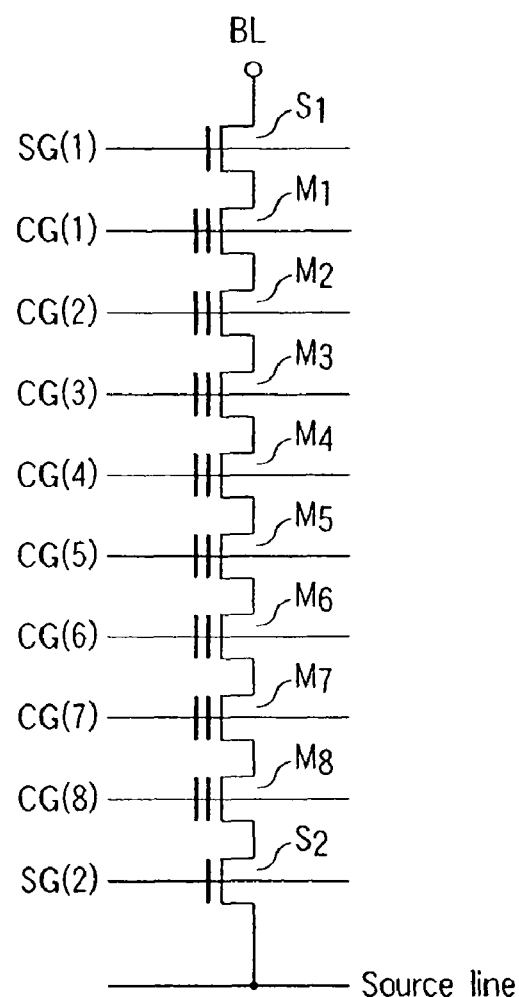
FIG. 4B is an equivalent circuit diagram for showing the one NAND cell portion of the memory cell array of FIG. 3.
Figure 5A:
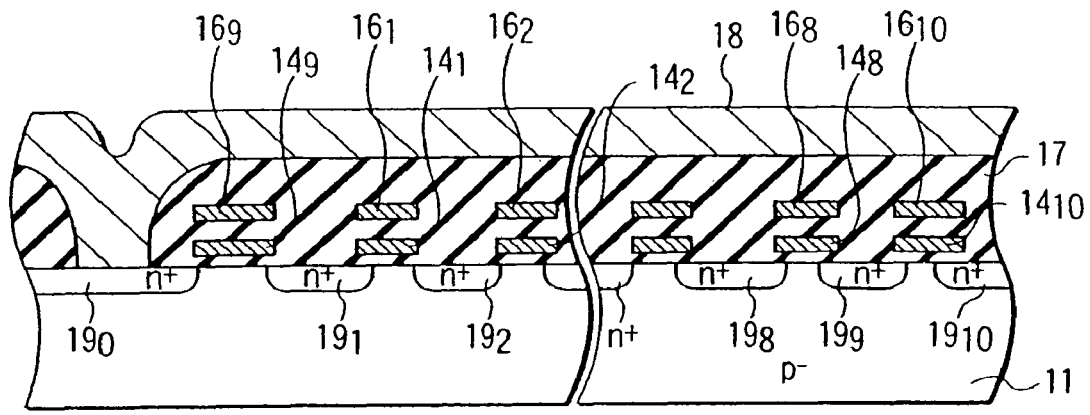
FIG. 5A is a cross-sectional view taken along line 5A-5A of FIG. 4.
Figure 5B:
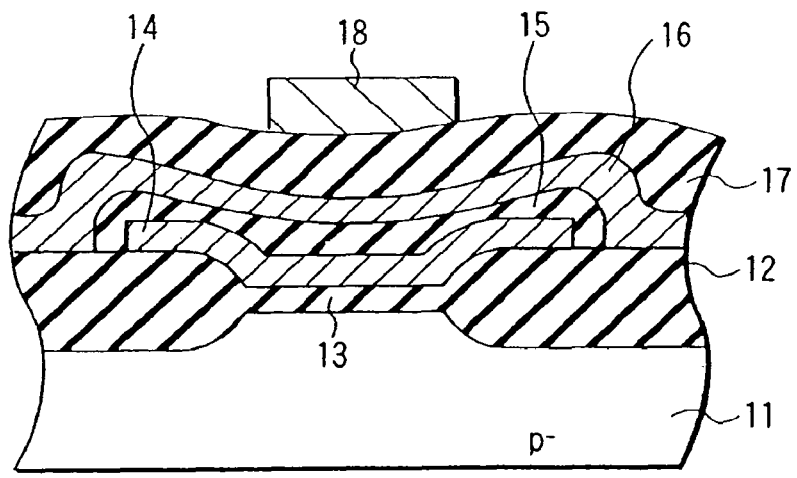
FIG. 5B is a cross-sectional view taken along line 5B-5B of FIG. 4.

FIGS. 4A and 4B are a pattern plan view and an equivalent circuit diagram respectively of one NAND cell portion in the above-mentioned memory cell array 101 and FIGS. 5A and 5B are cross-sectional views taken along lines 5A-5A and 5B-5B respectively of FIG. 4. On a p-type silicon substrate (or p-type well region) surrounded by an element isolating oxide film 12 is formed the memory cell array comprised of a plurality of NAND cells. As can be seen from a look at one of those NAND cells, in this embodiment, eight memory cells M1 to M8 are connected in series to thereby make up one NAND cell.

In configuration, in the memory cells M1 to M8 are formed via a gate insulating film 13 on the substrate 11 floating gates 14 (141, 142, ..., 148), on which are formed via an insulating film 15 control gates 16 (word lines of 161, 162, ..., 168). The n-type diffusion layers 19 (190, 192, ..., 1910) which provide sources and drains of those memory cells are connected in such a manner that adjacent paired ones of them may be shared in use as a source or a drain.

On the drain and source sides of the NAND cell are respectively formed a pair of select gates 149 and 169 and a pair of select gates 1410 and 1610 simultaneously with the memory cell floating gates and the control gates. The substrate 11 on which the elements are formed is covered by a CVD oxide film 17, on which a bit line 18 is provided. The bit line 18 is in contact with a drain-side diffusion layer 19 at one end of the NAND cell. Control gates 16 for the NAND cells arranged in rows are provided commonly as gate lines CG (1), CG(2), ..., CG(8). Those control gates provide word lines. The select gate pair of 149 and 169 and that of 1410 and 1610 are also sequentially provided as select gates SG(1) and SG(2) respectively in a row direction.

Figure 6:
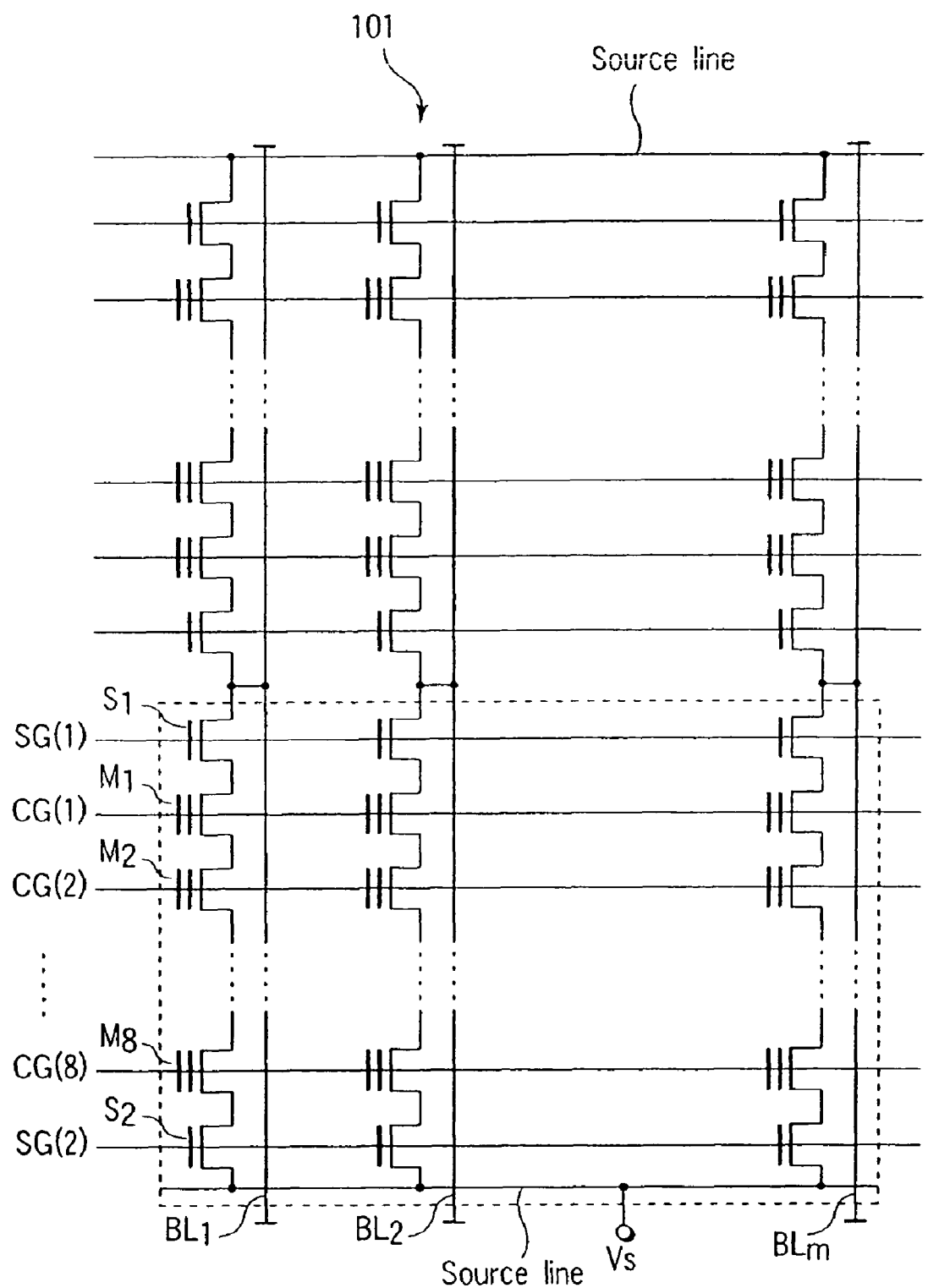
FIG. 6 is an equivalent circuit diagram of a memory cell array in which the AND cell is arranged in a matrix.

FIG. 6 shows an equivalent circuit diagram of the memory cell array in which such NAND cells are arranged in a matrix. A group of the NAND cells sharing the same word line or select line is called a block and, for example, a region surrounded by a broken line in FIG. 6 is defined as one block. During a usual read-out or programming operation, only one of a plurality of those blocks is selected, which is called a selected block.

FIG. 7 shows a configuration example of a row decoder circuit and part of the memory cell array in a semiconductor memory device according to the first embodiment of the present invention. In the configuration shown in FIG. 7, the elements in one block size of circuit is arranged on both sides of a memory cell block 2. The circuit shown in FIG. 7 features that transistors QN0 to QN10 connected to the control gates CG(1) to CG(8) and the select gates SG(1) and SG(2) are all of the n-channel type, that transistors QN1 to QN8 connected to the control gates CG(1) to CG(8) are provided one for each control gate line, and that PMOS transistors QP11 and QP12 are provided between an output node N1 and a power supply node VPPRW of a voltage switching circuit 54A for setting a gate voltage of the transistors QN0 to QN10 connected to the control gate CG(1) to CG(8) or the selected gate lines SG(1) and SG(2).

That is, between the control gates CG(1) to CG(8) and the signal input nodes CGD1 to CGD8 are connected current paths of the NMOS transistors QN1 to QN8 respectively. Furthermore, between the select gate line SG(1) and the signal input nodes SGD and SGDS are connected current paths of the NMOS transistors QN0 and QN9 respectively. Further, between the select gate line SG(2) and the signal input node SGS is connected a current path of the NMOS transistor QN10.

The above-mentioned voltage switching circuit 54A comprises PMOS transistors QP11 and QP12, NMOS transistors QN11 and QN12, and an inverter 55. The PMOS transistors QP11 and QP12, and NMOS transistors QN11 and QN12 are connected so as to act as a flip-flop 56, while one end of each of the current paths of the PMOS transistors QP11 and QP12 and the back gate are commonly connected to one power supply node VPPRW. The current paths of the NMOS transistors QN11 and QN12 are connected between the other end of each of the current paths of the PMOS transistors QP11 and QP12 and the other power supply node, e.g. a ground point. The gate of the PMOS transistor QP11 is connected to the other end of the current path of the PMOS transistor QP12 and a node N1, while the gate of the PMOS transistor QP12 is connected to the other end of the current path of the PMOS transistor QP11. The output terminal of the inverter 55 is connected to the gate of the NMOS transistor QN12 and the input terminal, to the gate of the NMOS transistor QN11.

The first input terminal of a NAND gate 57 is supplied with a signal RDEC and the second through fourth inputs, with signals RA1, RA2, and RA3 respectively. To the output terminal of this NAND gate 57 are connected an input terminal of an inverter 58 and a node N2. To an output terminal (node N0) of the inverter 58 are connected an input terminal of the inverter 55 and the gate of the NMOS transistor QN11.

Note here that the signal RDEC in FIG. 7 is a row decoder activating signal and generally at Vcc during a data programming, read-out, and erase operations and at 0V during non-operation. In addition, the signals RA1, RA2, and RA3 are respective block address signals and are all at Vcc in a selected block and at least one of them is at 0V in a non-selected block. Therefore, the node N0 is at Vcc only in a selected block during operation and always at 0V during non-operation or in a non-selected block.

Figure 9:
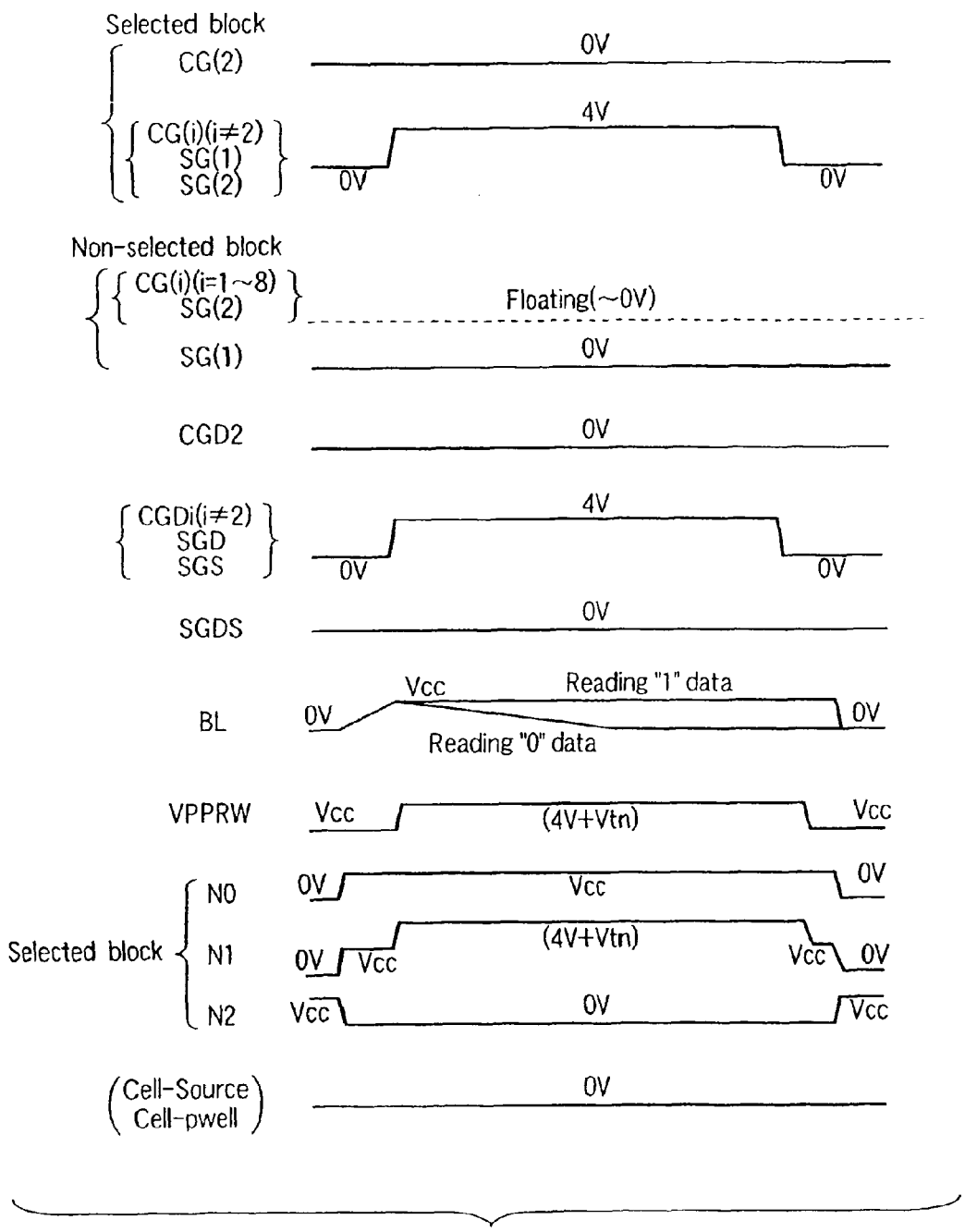
FIG. 9 is a timing chart for showing a data read-out operation in the semiconductor memory device according to the first embodiment of the present invention.
Figure 10:
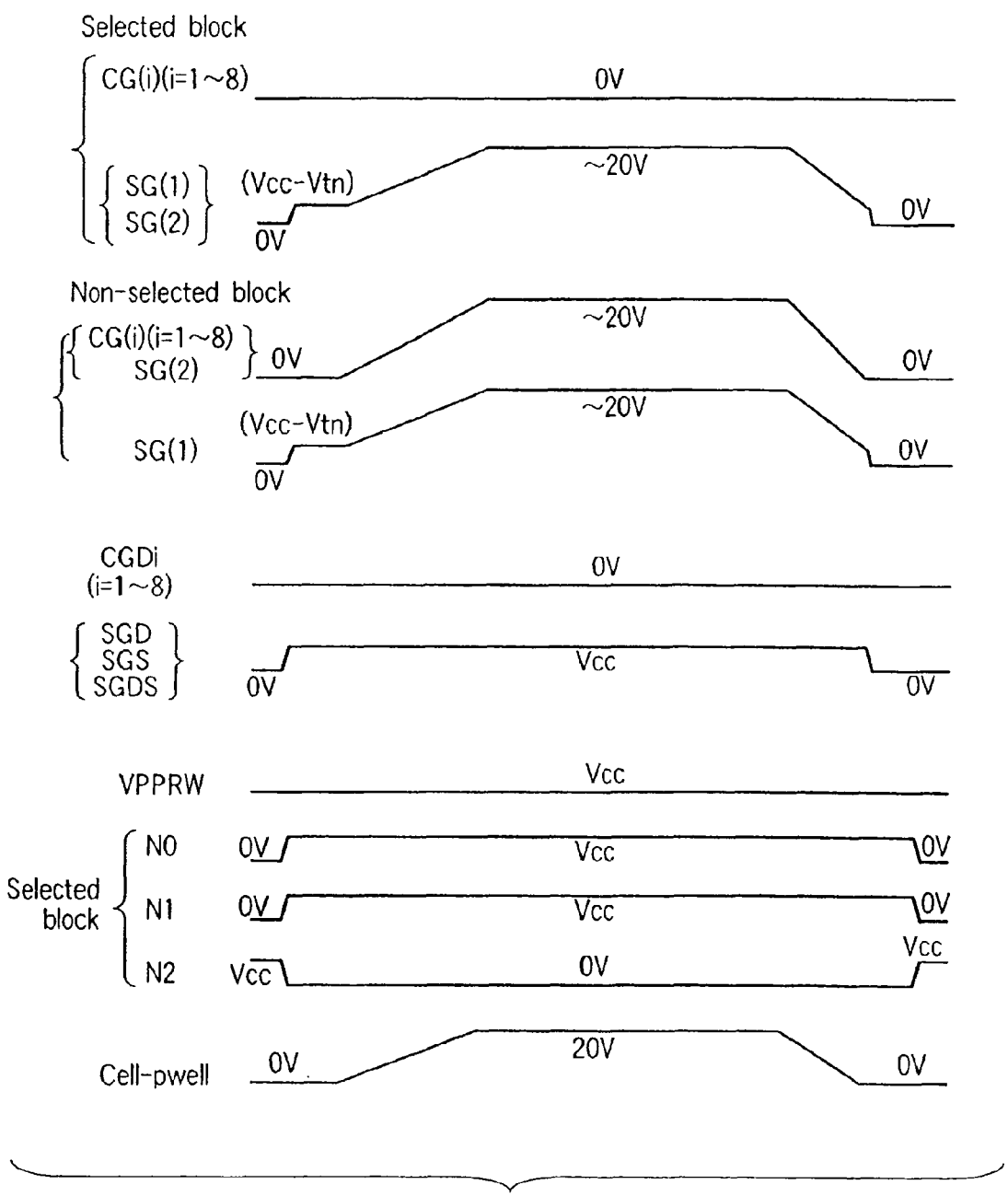
FIG. 10 is a timing chart for showing a data erase operation in the semiconductor memory device according to the first embodiment of the present invention.

FIGS. 8 to 10 show shows timing charts illustrating data programming, data read-out, and data erase operations by use of the circuit shown in FIG. 7 respectively. The following will describe timings for those operations briefly. Although a case will be described in which the control gate line CG(2) is selected of the eight control gate lines CG(1) to CG(8) in a selected block in the data programming and read-out operations of FIGS. 8 and 9 and the subsequent, the description holds true also with the case where any of the other control gates is selected.

In a data programming operation shown in FIG. 8, when the operation starts, first a row decoder in a selected block is selected to set the nodes N0 and N1 to Vcc and the node N2 to 0V. As a bit line having write-in data being "0" is charged up from 0V to Vcc, SG(1) in the selected block is set to [Vcc−Vtsg]. Then, the power supply node VPPRW is changed in voltage from Vcc to (20V+Vtn) (where Vtn is a threshold voltage of the NMOS transistors QN1 to QN8 directly connected to the control gates CG(1) to CG(8)), which in turn changes the voltage of the output node N1 of the voltage switching circuit 54A also from Vcc to (20V+Vtn).

When, subsequently, the signal input node CGD2 is changed from 0V to 20V and the signal input nodes CGD1 and CGD3 to CGD8 are changed from 0V to 10V in voltage, since at this point in time the voltage of the gate of the NMOS transistor connected to the control gate line is at (20V+Vtn), the voltage is applied without a potential drop from the signal input node CGDi to the control gate line CG(1), thus changing the control gate CG(2) from 0V to 20V and the control gate lines (CG(1) and CG(3) to CG(8) from 0V to 10V in voltage. At the same time, the voltage Vchannel of the channel portion of a NAND cell of the selected block connected to the "1" write-in bit line is fixed at 0V, while the voltage Vchannel of the channel portion of a NAND cell in the selected block connected to the "0" write-in bit line is raised to 8V or so due to an influence of capacitive coupling with the control gate line. This state is held for a while, to cause electrons to be injected to the floating gate of a memory cell having "1" write-in data, thus carrying out a data programming operation. Afterward, when the control gate lines CG(1) to (8) in the selected block are all set to 0V, the "0" data write-in bit lines and the select gate line SG(1) are set to 0V and the power supply node VPPRW is set to Vcc. Finally, the source line (Cell-Source) is set to 0V and the nodes N0, N1, and N2 are set to 0V, 0V, and Vcc respectively, thus ending the data programming operation.

In a data read-out operation shown in FIG. 9, when the operation starts, first a row decoder in a selected block is selected and the nodes N0 and N1 are set to Vcc and the node N2, to 0V. Furthermore, a bit line for data read-out is pre-charged to Vcc. Then, when the power supply node VPPRW and the node N1 are set to (4V+Vtn) and the signal input nodes CGD1 and CGD3 to CGD8 and the signal input nodes SGD and SGS are changed from 0V to 4V and the signal input node CGD2 is fixed at 0V in voltage, since at this point in time the gate of an NMOS transistor connected to a control gate or select gate line is supplied with an application voltage higher than 4V by a threshold voltage, that application voltage can be applied to the control line or select gate line. In this case, therefore, in the selected block, the non-selected control gate lines CG(1) and CG(3) to CG(8) and the selected gate lines SG(1) and SG(2) are changed from 0V to 4V and the selected control gate line is fixed at 0V in voltage. This state is held for while, thus reading out the data in a selected memory cell. Subsequently, the control gate lines CG(1) to CG(8) and the selected gate lines SG(1) and SG(2) in the selected block are all set to 0V and also the power supply node VPPRW is changed from (4V+Vtn) to Vcc, the bit line is set to 0V and the nodes N0, N1, and N2 are set to 0V, 0V, and Vcc respectively in voltage, thus ending the data read-out operation.

In a data erase operation shown in FIG. 10, when the operation starts, first a row decoder in a selected block is selected and the nodes N0 and N1 are set to Vcc and the node N2 is set to 0V. Moreover, since the signal input nodes SGD, SGD, and SGDS are all set to Vcc, the select gate line SG(1) in both the selected and non-selected blocks and the select gate line SG(2) in the selected block are all charged up to (Vcc−Vtn) and then enter a floating state. At this point in time, the control gate line and the select gate line SG(2) in the non-selected block are all in a floating state as held at 0V or so. Subsequently, when the p-type well region (Cell-pwell) in which the memory cell array is formed is changed from 0V to 20V in voltage, the select gate lines SG(1) and SG(2) in both the selected and non-selected blocks and the control gate line in the non-selected block in a floating state all rise to 20V or so due to an influence of capacitive coupling with the p-type well region, thus fixing only the control line in the selected block at 0V. This state is held for a while, to thereby cause electrons to be injected to from the floating gate in a memory cell in the selected block to the p-type well region, thus carrying out data erase. Subsequently, when the p-type well is changed to 0V in voltage, the select gate lines SG(1) and SG(2) in both the selected and non-selected blocks and the control gate line in the non-selected block in a floating state all drop to 0V-Vcc or so due to an influence of capacitive coupling with the p-type well region and then are fixed at 0V. Finally, the nodes N0, N1, and N2 are changed to 0V, 0V, and Vcc respectively in voltage, thus ending the data erase operation.

As mentioned above, in the row decoder circuit shown in FIG. 7, during a data programming or read-out operation, by applying to the power supply node VPPRW a voltage higher at least by Vtn (threshold voltage of the voltage application transistors QN0 to QN10) than the highest voltage applied to the control gate line and the select gate line, a programming high voltage or a read-out high voltage can be applied to the control gate without a potential drop to thereby realize a highly reliable operation even if only an NMOS transistor is connected to each control gate line or select gate line.

Furthermore, by providing only one NMOS transistor connected to each control gate line, a row decoder circuit having fewer elements can be realized, to reduce its pattern area, thus decreasing the chip size hence the chip cost.

Further, by using such a voltage switching circuit 54A for outputting a "high" level voltage via the PMOS transistors QP11 and QP12, which are opposite in conductivity type to the transistor connected to the control gate line or the select gate line, the voltage switching circuit 54 can be made up with fewer elements and a smaller pattern occupied area, to realize a row decoder with fewer elements and a smaller pattern occupied area, which in turn reduces the chip size hence the chip cost.

Figure 11:
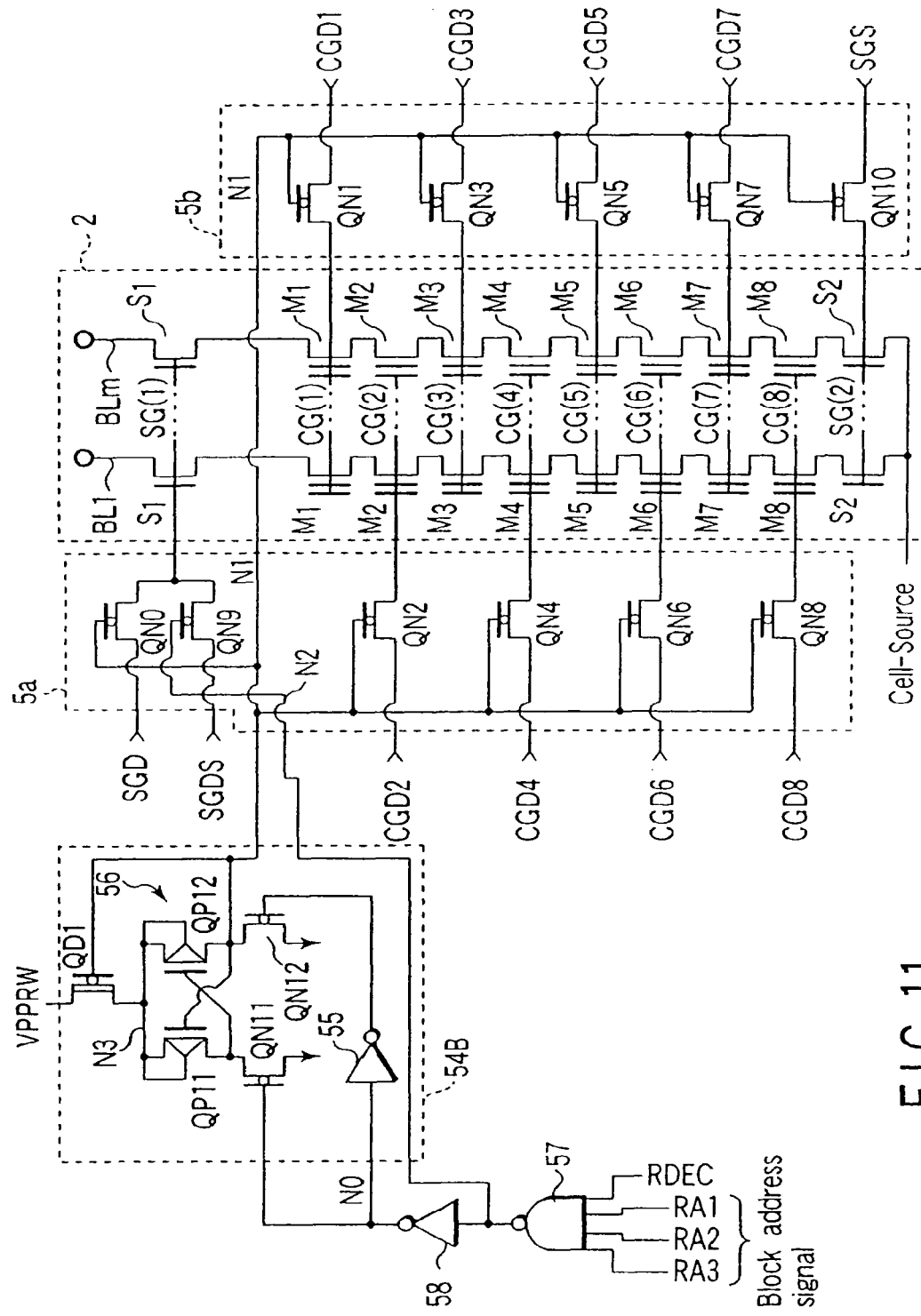
FIG. 11 is a circuit diagram for showing a configuration of a row decoder circuit and part of a memory cell array in a semiconductor memory device according to a second embodiment of the present invention.

FIG. 11 shows a configuration example of another part of the row decoder circuit in the semiconductor memory device according to a second embodiment of the present invention. The circuit in FIG. 11 differs from that of FIG. 7 in a circuit configuration of its voltage switching circuit 54B, in which a depletion type NMOS transistor QD1 between the power supply node VPPRW and a pair of the transistors QP11 and QP12. Timing charts for data programming, read-out, and erase operations by use of the circuit shown in FIG. 11 are the same as those in FIGS. 8 to 10.

The following will describe advantages of providing the transistor QD1.

Since, in the circuit of FIG. 7, a potential level of the power supply node VPPRW is directly applied to the sources of the PMOS transistors QO11 and QP12 and the n-well region constituting these transistors, in all the blocks irrespective of whether selected or non-selected, the sources and the n-well region of the transistors QP11 and QP12 need to be charged up to the potential level of the power supply node VPPRW. This means that the sources and the n-well regions of several hundreds to several thousands of elements should be charged up simultaneously to enlarge the capacitance of the power supply node VPPRW, because blocks are generally provided several hundreds to several thousands on each chip. In a data programming or read-out operation, a boosted voltage such as (20V+Vtn) or (4V+Vtn) is applied to the power node VPPRW, so that if the power supply node VPPRW has a larger capacitance, there would occur such problems as an increased size of a boosted voltage generating circuit, a larger power dissipation, a longer time required for charging of the boosted voltage, and resultant prolonged operations.

In the circuit of FIG. 11, on the other hand, since the node N0 is at "high" level (=Vcc) in a selected block, the voltage of the node N1 input to the gate of the transistor QD1 is at a "high" level (=VPPRW potential level) and the voltage of the node N3 at a potential of the source and n-well region of the transistors QP11 and QP12 is also at a "high" level (=VPPRW potential level), thus enabling realizing the operations of FIGS. 8 to 10 irrespective of whether the transistor QD1 is provided or not. Since the node N0 is at 0V, i.e. "low" level, in a non-selected block when the circuit of FIG. 11 is in use, the node N1 input to the gate of the transistor QD1 is fixed at 0V, so that the node N3 is at Vtd (where Vtd indicates the highest possible voltage, generally Vcc or lower, that can be applied via the transistor QD1 when the gate voltage of the transistor QD1 is equal to 0V).

Thus, by using the circuit of FIG. 11, the potential of the source and n-well region of the transistors QP11 and QP12 can be changed in selected and non-selected blocks.

Figure 12A:
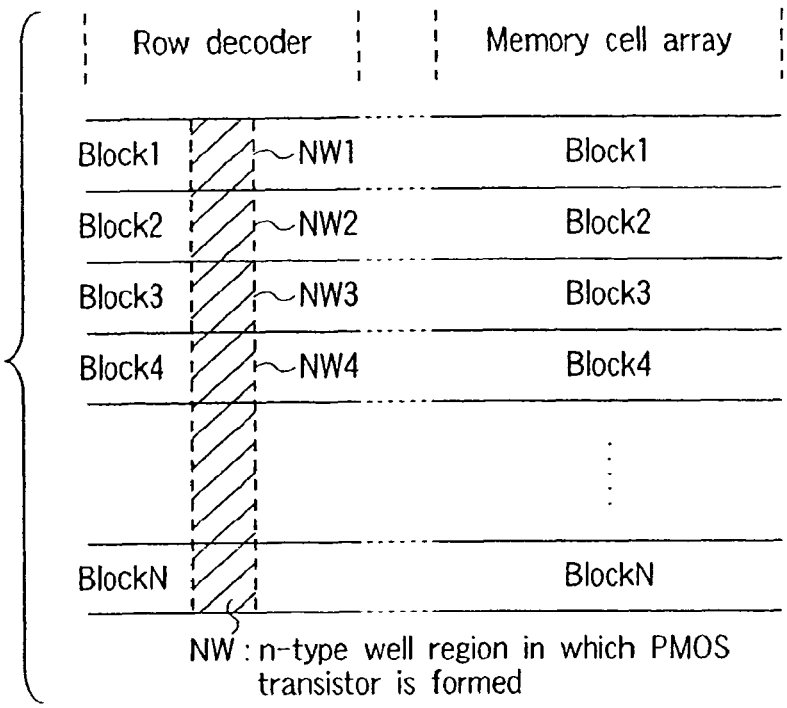
FIGS. 12A and 12B are illustrations for explaining a shape of an n-well region in the row decoder circuit in the semiconductor memory devices according respectively to the first and second embodiments of the present invention.
Figure 12B:
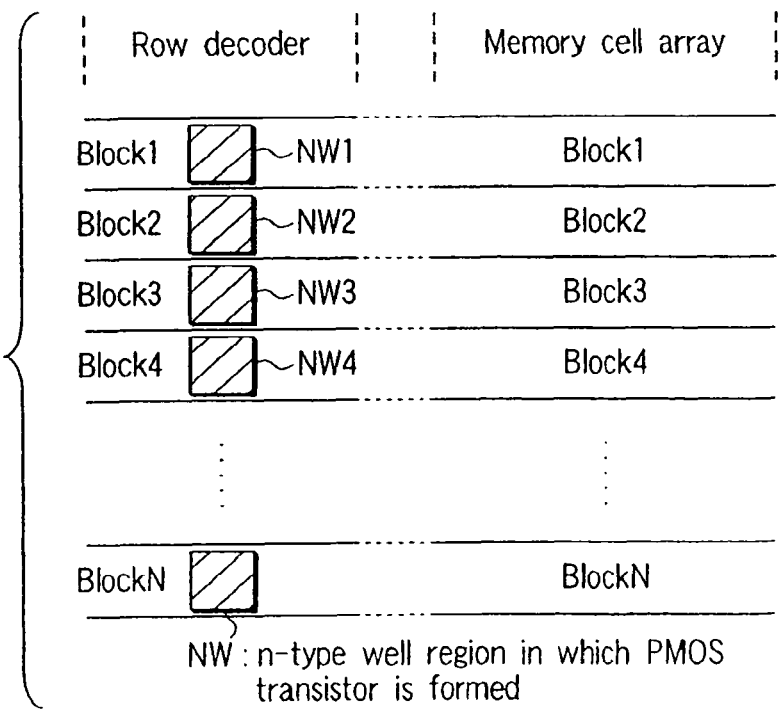

The shapes of the n-well region constituting the transistors QP11 and QP12 are shown in FIGS. 12A and 12B. FIGS. 12A and 12B show examples of forming the n-well region when the circuit configurations of FIGS. 7 and 11 are employed respectively. In the circuit of FIG. 7, since the n-well voltage is at the same potential in all the blocks, as shown in FIG. 12A, such a method is employed that one n-well region NW is formed over all the blocks Block1-BlockN to form the PMOS transistors QP11 and QP12 in this region.

In the circuit of FIG. 11, on the other hand, since the n-well voltage is different between the selected and non-selected blocks, as shown in FIG. 12B, such a method is effective that one n-well region NW1 to NWN is formed for each block Block1-BlockN to form the PMOS transistors QP11 and QP12 in these regions NW1 to NWN. The n-well regions are thus divided into the blocks in a one-to-one relationship to charge up only a selected n-well region to a boosted voltage (20V or 4V) higher than the power supply voltage, thus enabling greatly decreasing the load capacitance of the boosted voltage. This in turn can reduce the area of the boosted voltage generating circuit, the power dissipation, and the time required for charging the boosted voltage, thus speeding up the operations.

Figure 13:
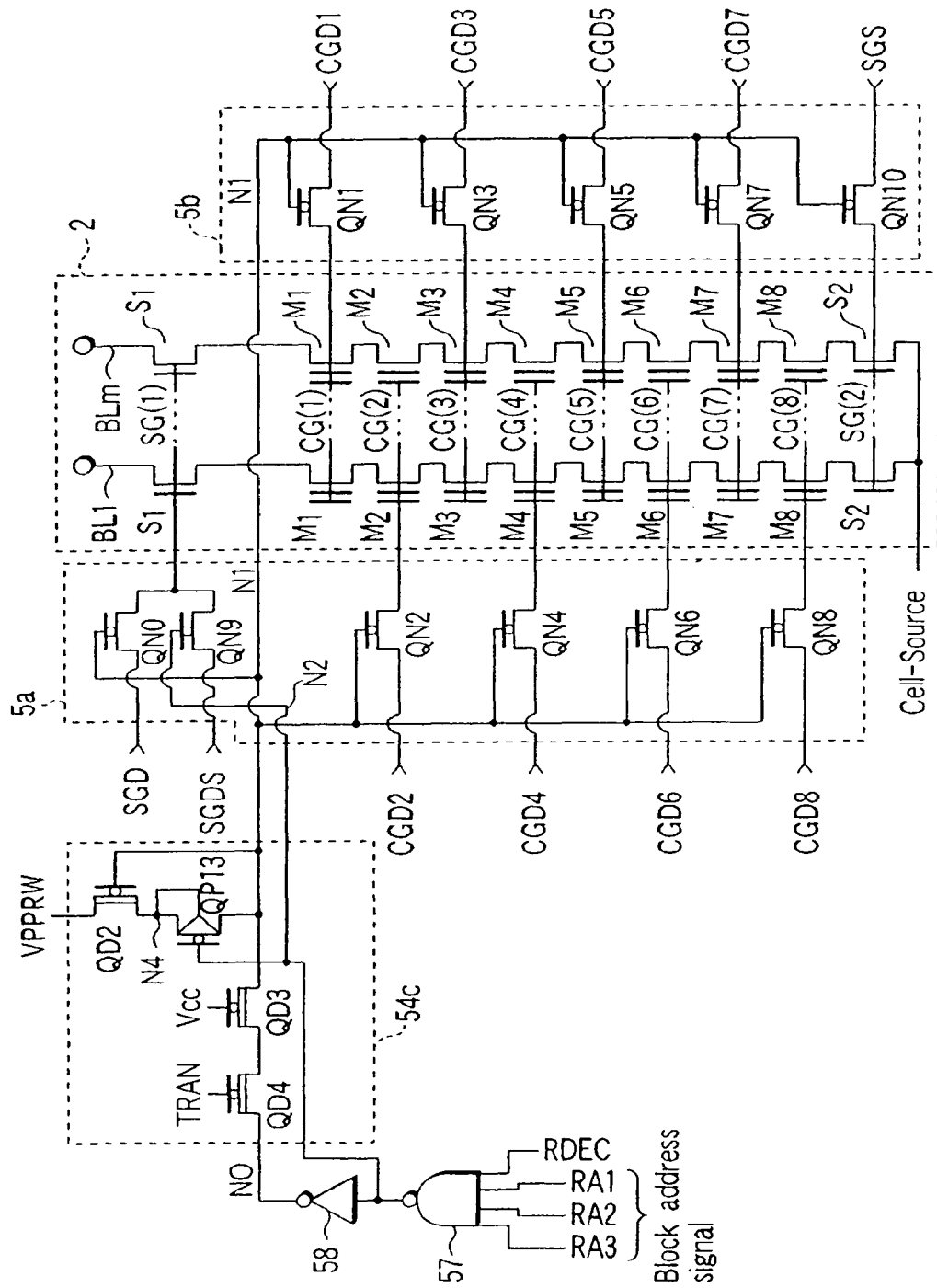
FIG. 13 is a circuit diagram for showing a configuration example of a row decoder and part of a memory cell array in a semiconductor memory device according to a third embodiment of the present invention.

FIG. 13 shows a configuration example of further another part of the row decoder circuit in the semiconductor memory device according to a third embodiment of the present invention. The circuit of FIG. 13 differs from that of FIGS. 7 and 11 in a configuration of its voltage switching circuit 54C. This voltage switching circuit 54C comprises depletion type NMOS transistors QD2, a PMOS transistor QP13, and depletion type NMOS transistors QD3 and QD4. One end of a current path of the NMOS transistor QD2 is connected to the power supply node VPPRW and its gate, connected to the node N1. One end of a current path of and a back gate of the PMOS transistor QP13 are connected to the other end of the current path of the NMOS transistor QD2 and the other end of the current path is connected to the node N1 and the gate thereof, to an output terminal of the NAND gate 57. One end of a current path of the NMOS transistor QD3 is connected to the node N1 to apply the power supply voltage Vcc to its gate. One end of a current path of the NMOS transistor QD4 is connected to the other end of the current path of the NMOS transistor QD3 and the other end thereof is connected to an output terminal of the inverter 58 to supply a signal TRAN to the gate thereof.

Operation waveforms of the circuit of FIG. 13 are the same as those shown in FIGS. 8 to 10 and the voltage on the node N4 in FIG. 13 is also the same as that on the node N3 in FIG. 11. Accordingly, like in a case where the circuit of FIG. 11 is used, when the circuit of FIG. 13 is also used, the voltage on the node N4 is different between a selected block and a non-selected block, that is the voltage of the source and n-well region of the PMOS transistor QP13 for applying a "high" level (=boosted voltage) to the node N1 is different between the selected and non-selected blocks. Accordingly, such an n-well configuration as shown in FIG. 12B can be used to resultantly reduce the load capacitance of the boosted voltage. In addition, the signal TRAN is usually used as fixed at 0V and the node N0 is also at 0V in a non-selected block, so that 0V is applied to the Node N1 via the deletion type NMOS transistors QD4 and QD3. Further, in a selected block, the node N0=Vcc and the node N1≧Vcc in voltage, so that the NMOS transistor QD4 is turned OFF, to thereby hold the Node N1 at a "high" level.

The above-mentioned circuit shown in FIG. 13 has other advantages such as a first one that it has fewer elements required to constitute the voltage switching circuit 54C (four in FIG. 13 as against seven in FIG. 11) and a second one that it has a smaller difference in potential between the source, drain, and n-well regions of the PMOS transistor QP13. As for the latter advantage, when the transistor QP13 is ON, always source region=drain region=n-well region, and when it is OFF, source region=n-well region=Vtd (where Vtd is the highest value of a voltage that can be applied via the transistor QD2 when the gate voltage of the transistor QD2 is equal to 0V) and also drain region=0V in voltage, so that the potential difference between the source, drain, and n-well regions is at most Vcc or so despite an operation whereby a programming high voltage (20V or so) is applied.

Although the above embodiment of the present invention has been described with reference to a case where as shown in FIGS. 7, 11, and 13 the row decoder circuit for driving the control gate line and the select gate line in each block is arranged on both sides of the memory cell array, the present invention is applicable also to other cases where as shown in FIG. 14, for example, the row decoder corresponding to each block is arranged on one side of the memory cell array. Although FIG. 14 does not show any specific circuit configuration as that of the voltage switching circuit 54D, a variety of other circuit configurations may be used such as those shown in, for example, FIGS. 7, 11, and 13.

Figure 15:
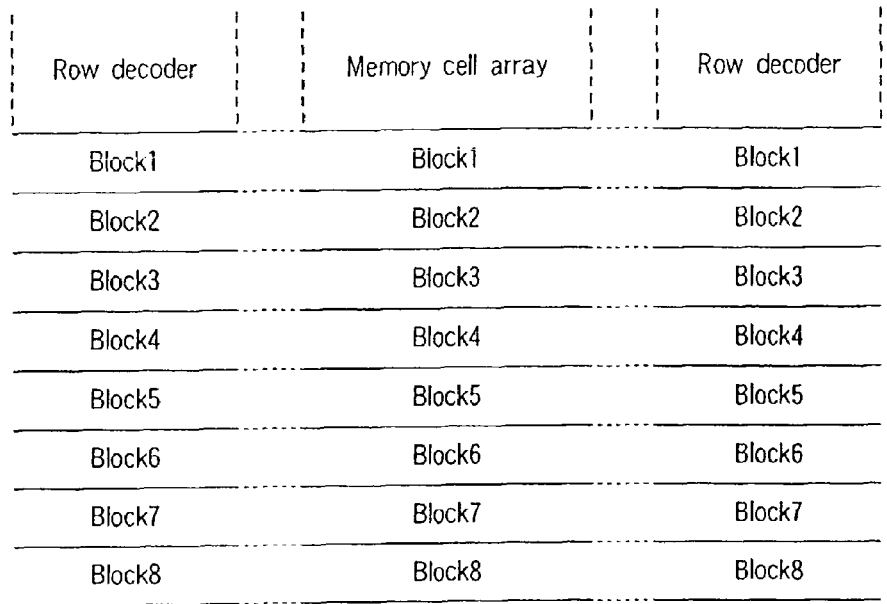
FIG. 15 is an illustration for showing a first block arrangement example of the memory cell array and the row decoder circuit in the semiconductor memory device according to the embodiment of the present invention.
Figure 16:
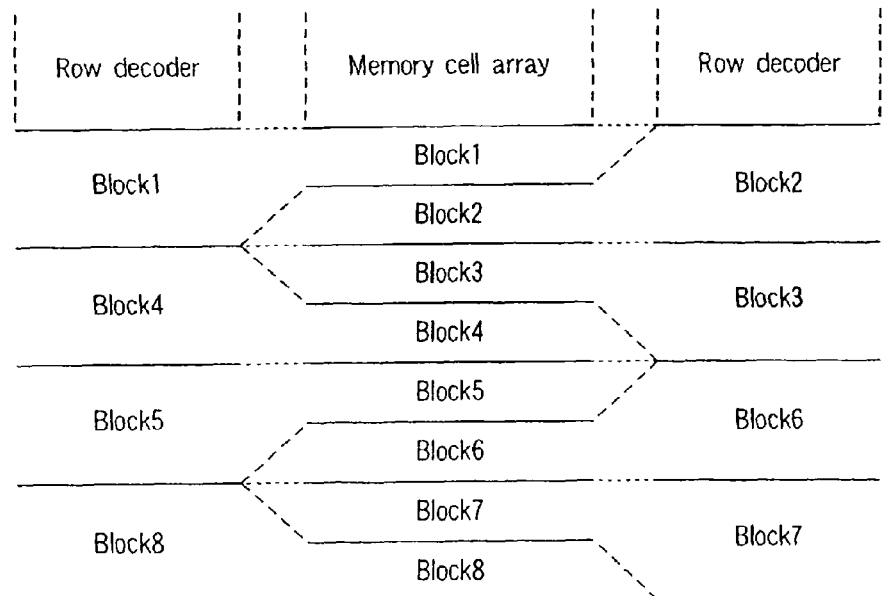
FIG. 16 is an illustration for showing a second block arrangement example for the memory cell array and the row decoder circuit in the semiconductor memory device according to the embodiment of the present invention.
Figure 17:
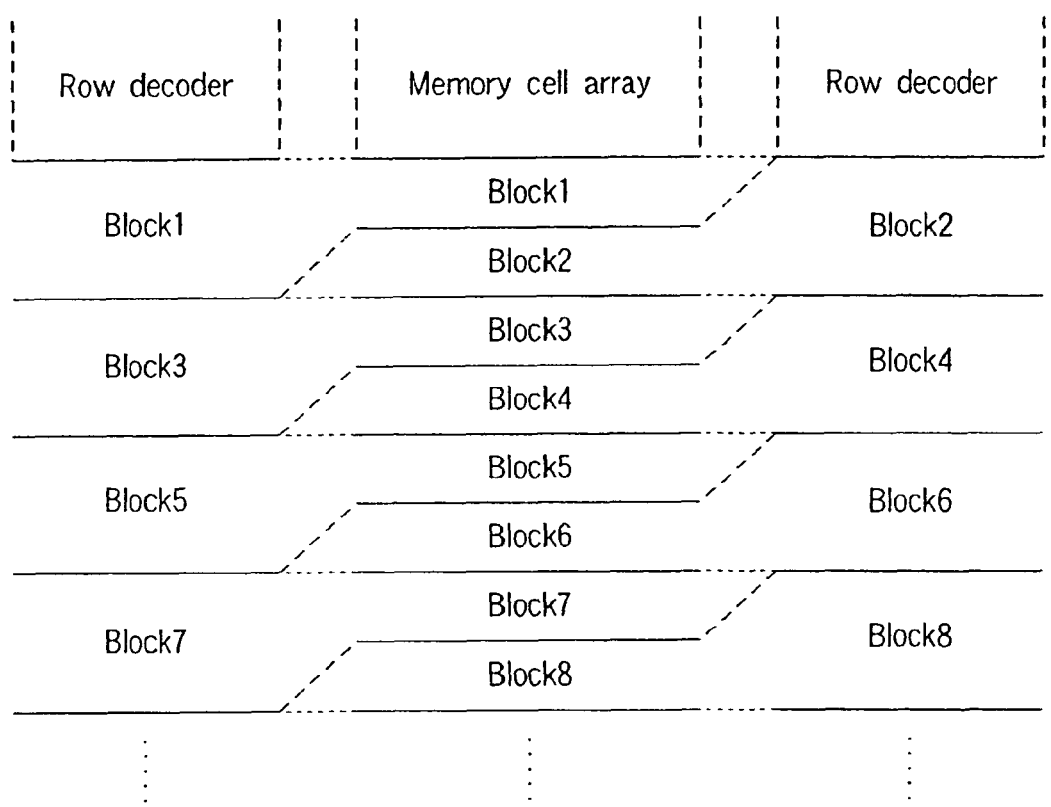
FIG. 17 is an illustration for showing a third block arrangement example for the memory cell array and the row decoder circuit in the semiconductor memory device according to the embodiment of the present invention.

Now, FIGS. 15 to 17 show an example of arranging the row decoder. FIG. 15 shows a case where the row decoder circuit for driving the control gate line and the select gate line in each block is arranged on both sides of the memory cell array, corresponding to the embodiment shown in FIGS. 11 and 13. FIGS. 16 and 17 both show a case where the row decoder corresponding to each block is arranged on one side of the memory cell array, corresponding to FIG. 14. A width (pitch) of a created pattern of the row decoder corresponding to one block is a length of two NAND cells when a configuration of FIGS. 16 and 17 is employed, which is larger than a length of one NAND cell (length of one NAND cell in the bit line direction) for that of FIG. 15.

Figure 20:
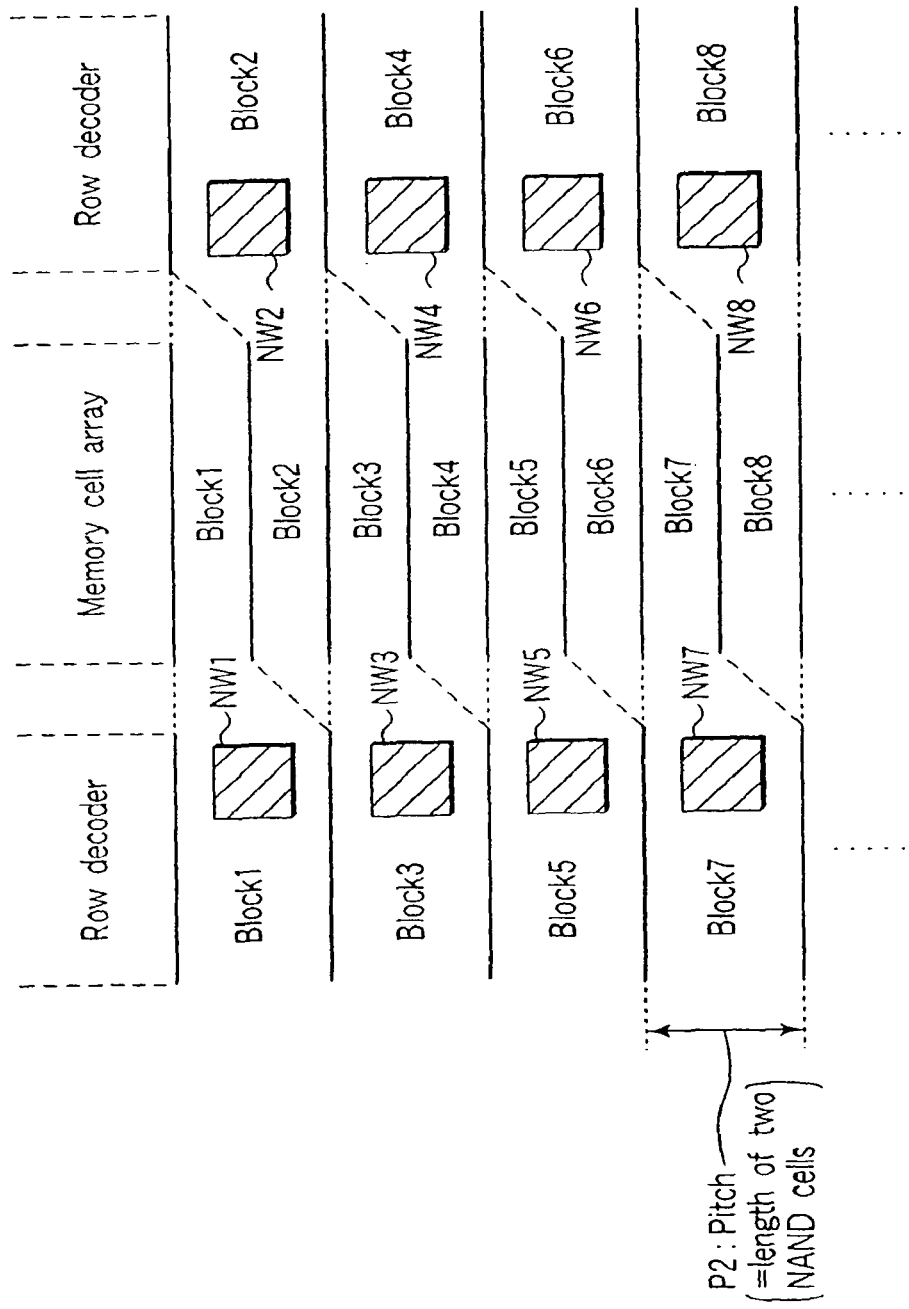
FIG. 20 is an illustration for showing a third example of the block arrangement of the memory cell array and the row decoder and the shape of the n-well region in the semiconductor memory device according to the embodiment of the present invention.

FIGS. 18 to 20 show a configuration that an n-well region for forming a PMOS transistor is added to the above-mentioned configuration of FIGS. 15 to 17. FIGS. 15 to 17 correspond to FIGS. 18 to 20 respectively. As may be obvious from FIGS. 18 to 20, the configuration shown in FIG. 14 has a pitch for forming a pattern of the row decoder circuit twice that shown in FIGS. 11 and 13, hence a double pitch of the n-well region for forming the PMOS transistor. Accordingly, the design rules can be relaxed, thus realizing a chip having higher reliability and yield. Moreover, even with the finer design rules possible in the future, the configuration shown in FIG. 14 has a feature that the n-well region may be divided into a plurality of blocks more likely than that shown in FIGS. 11 and 13.

The above-mentioned n-well region may be arranged otherwise, for example as shown in FIGS. 21A to 21E. FIGS. 21A to 21E show the row decoder region, specifically only those blocks adjacent in a region in which the row decoder pattern is formed.

Figure 21A:
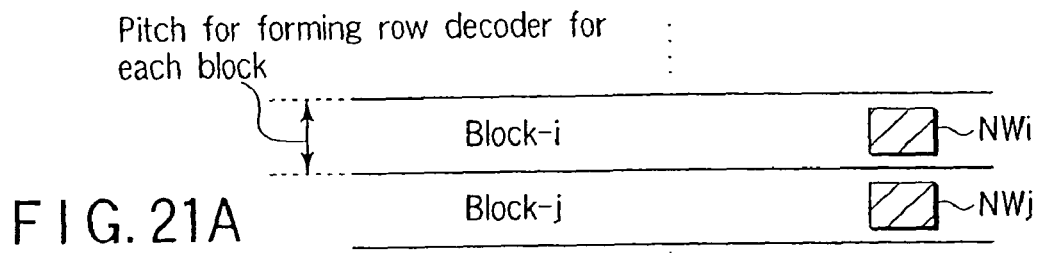
FIGS. 21A to 21E are illustrations for explaining the row decoder circuit block arrangement and the n-well region shape in the semiconductor devices according to the first through fourth embodiments and many other embodiments of the present invention.

FIG. 21A shows the configuration shown in FIGS. 18, 19, and 20 (i.e., configuration in which that shown in FIG. 21A is applied to a block arrangement shown in FIGS. 15 to 17), in which n-well regions NWi and NWj are formed in adjacent blocks Block-i and Block-j respectively.

Figure 21B:
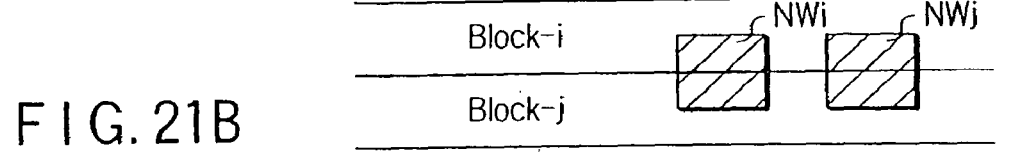
Figure 21C:
Figure 21D:

FIGS. 21B, 21C, and 21D show cases where for the row decoder corresponding to each block, the n-well regions NWi and NWj are formed over a plurality of blocks Block-i and Block-j, so that if a one-block pitch for forming the row decoder cannot accommodate the design rules for the surrounding of the n-well regions NWi and NWj, such a configuration shown in FIGS. 21B, 21C, and 21D is effective that one n-well region is formed in two blocks of a region.

Figure 21E:
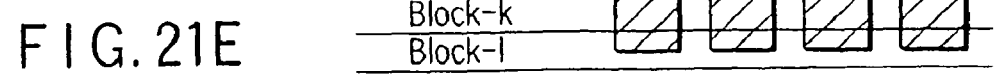

In case of more stringent design rules in the future, as shown in FIG. 21E, one n-well region NWi-NW1 should preferably be formed in four blocks of Block-i-Block-1 or even in three or five or even more blocks, thus providing a variety of applicable configurations.

Thus, the application of the configuration of FIGS. 21B to 21E to the block arrangement of FIGS. 15 to 17 is very effective in accommodating a reduction in the design rules. In particular, since the n-well region such as the above-mentioned PMOS transistors QP11, QP12, and QP13 to which is applied a voltage (e.g., boosted voltage) higher than the power supply voltage is difficult to reduce the design rules, enlargement in the pitch and relaxation of the design rules have large effects.

In FIGS. 11, 12A, 12B, 13, 14, 18 to 20, and 21A to 21E, such an embodiment has been described that one n-well region for forming PMOS transistors therein is provided for each block of the row decoder circuit. The present invention, however, is effective also in a case where, for example, one n-well region is shared over adjacent blocks.

FIGS. 22 to 25 show a circuit configuration example of an address decoding portion and the voltage switching circuit portion 54 (54A, 54B, 54C, and 54D) of two adjacent blocks of the row decoder circuit in a case where one n-well region is shared by adjacent blocks and also in the case of the above-mentioned circuit. FIG. 22 corresponds to the circuit of FIG. 11 and FIG. 23, to that of FIG. 13.

Figure 25:
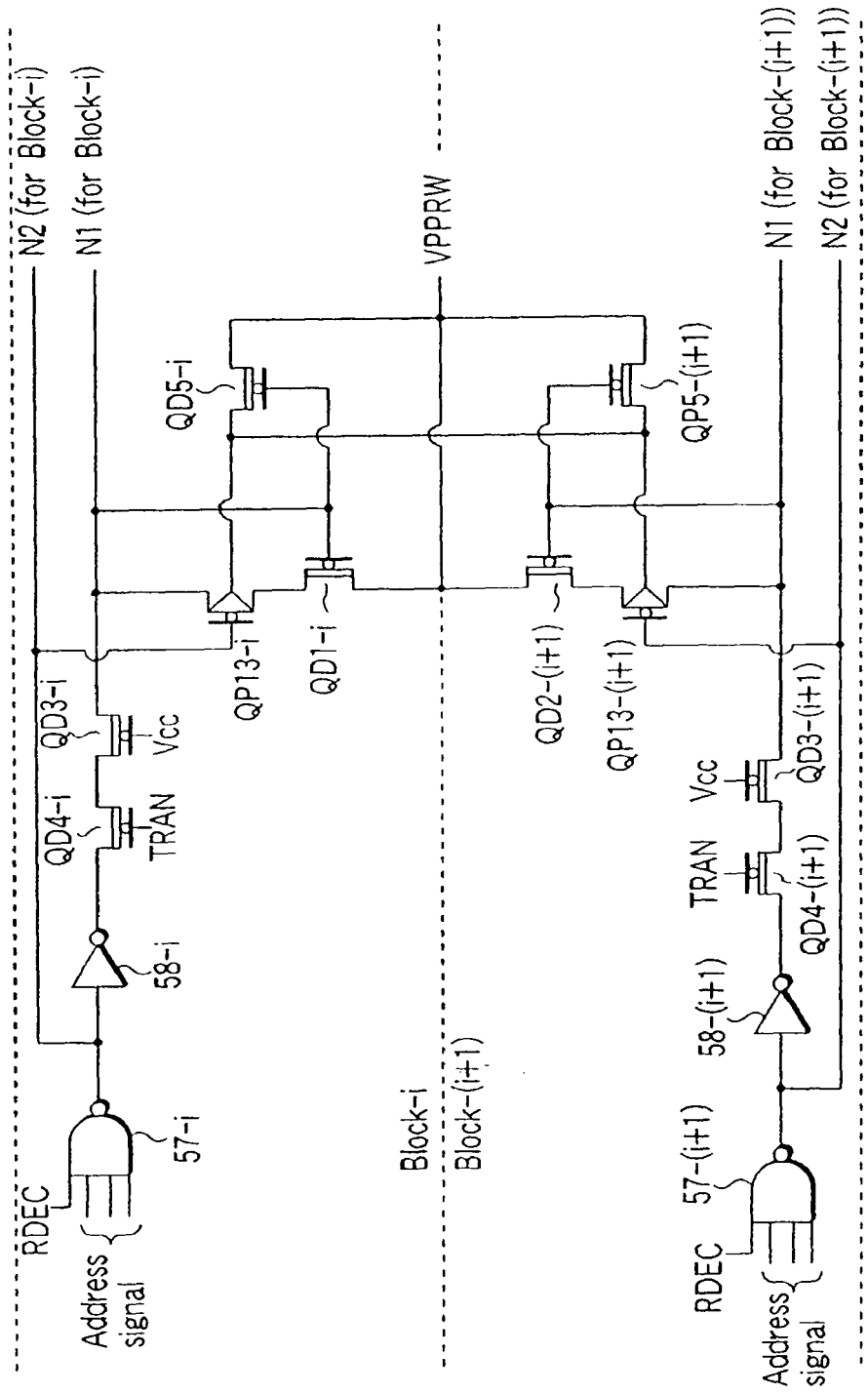
FIG. 25 shows circuit diagrams for illustrating a fourth configuration of the row decoder circuit in the block address decoder portion and the voltage switching circuit in the semiconductor devices according to the first through fourth embodiments and many other embodiments of the present invention.

FIG. 24 shows a circuit configuration example in the case where one n-well region is shared over adjacent blocks, corresponding to a configuration based on the circuit shown in FIG. 11. FIG. 25 shows a circuit configuration example in a case where one n-well region is shared over adjacent blocks, corresponding to a configuration based on the circuit shown in FIG. 13. FIG. 24 has no addition of elements with respect to FIG. 22, while FIG. 25 has an addition of one depletion type NMOS transistor for each block with respect to FIG. 23.

When the circuit shown in FIGS. 24 and 25 is used, if at least one of the two blocks sharing the n-well region is selected, the n-well region is set at a voltage at the time of selection (i.e., 20V+Vtn at write-in, 4V+Vtn at read-out, and Vcc at erase) and otherwise, the n-well region is set at Vtd, i.e. voltage at the time of unselection. Also in this case, since the n-well region to which a boosted voltage is applied includes a selected block, there is provided such an advantage that the load capacitance of the boosted voltage can be greatly reduced as compared to the conventional case (which corresponds to FIG. 12A).

Although the present invention has been described with a case where in FIGS. 22 to 25, continual-address blocks of Block-i and Block-(i+1) are adjacent as the adjacent ones in the row decoder circuit region, other cases of the blocks not being of continual addresses can of course be accommodated by the present invention as far as the n-well region is shared over the adjacent blocks in the row decoder circuit region.

Figure 26:
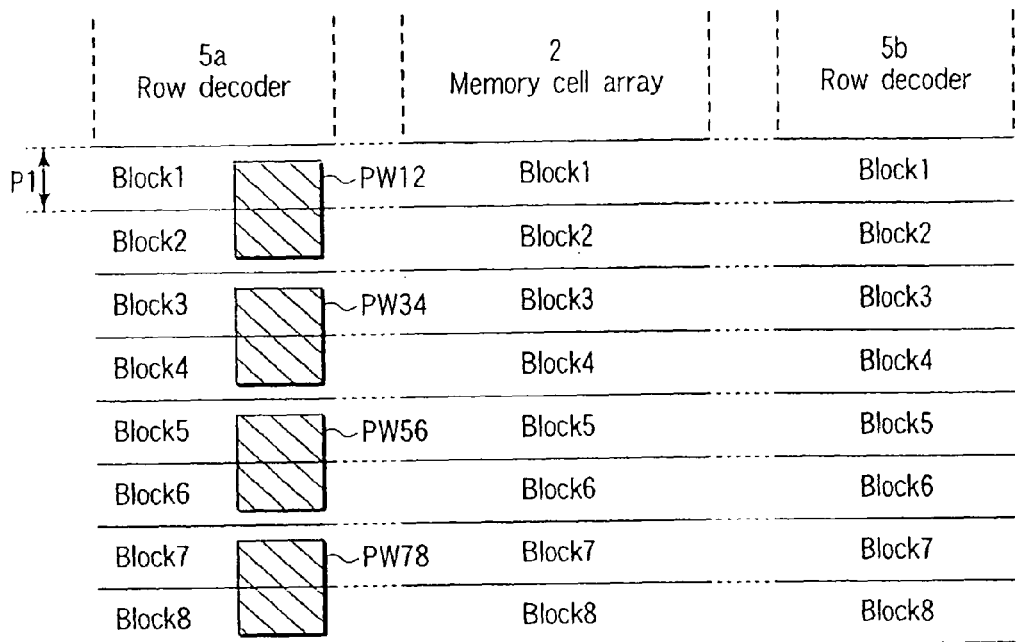
FIG. 26 is an illustration for explaining the row decoder circuit block arrangement and the n-well region shape in the semiconductor memory device according to many other embodiments.
Figure 27:
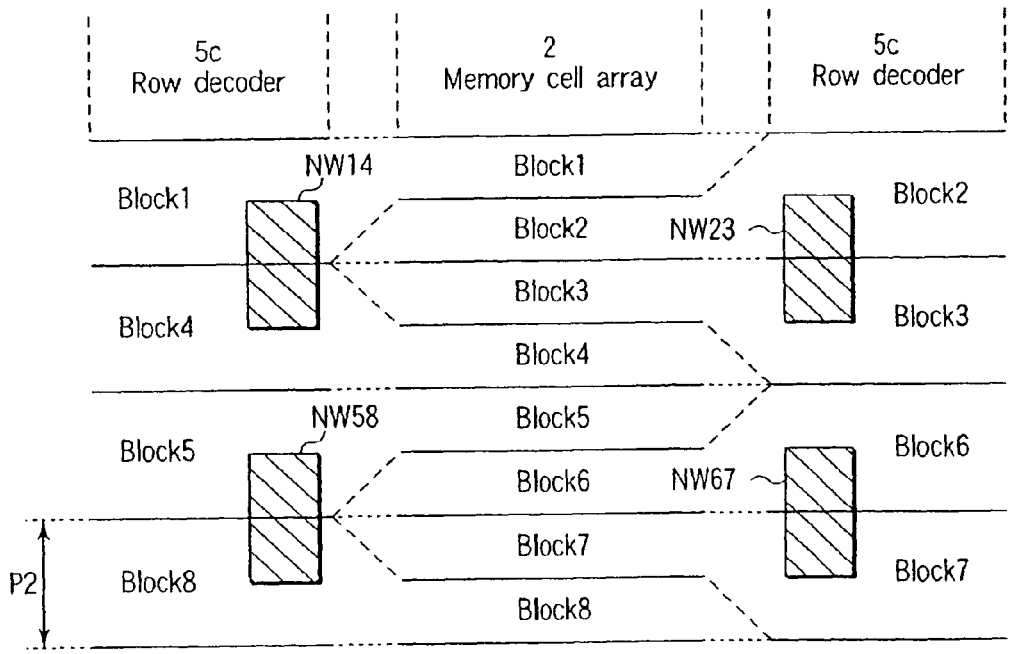
FIG. 27 is an illustration for explaining the row decoder circuit block arrangement and the n-well region shape in the semiconductor memory device according to many other embodiments.

FIGS. 26 to 28 show a formation example of the n-well region when the circuit configuration shown in FIGS. 24 and 25 is used, in which one n-well region is shared over adjacent blocks in configuration. By using the configuration shown in FIGS. 24, 25, and 26 to 28, it is possible to enlarge the pitch for the formation of the n-well region hence relax the design rules of the surroundings of the n-well region as compared to the case of using that shown in FIGS. 22, 23, and 18 to 20, thus improving the reliability and the yield. In particular, since the n-well region including the above-mentioned PMOS transistors QP11, QP12, QP13, etc. to which a voltage (e.g., boosted voltage higher than the power supply voltage) is applied is difficult to reduce the design rules, the pitch enlargement and the deign relaxation of the above-mentioned configuration are very effective.

Further, the configuration shown in FIGS. 24, 25, and 26 to 28 has an advantage of decreasing the number of the n-well regions, thus reducing the area of the pattern of the row decoder circuit. There is provided such a method for further relaxing the design rules shown in FIGS. 29A and 29B that one n-well region common to two blocks is provided for the pitch of three to four blocks, which is the same concept as that of FIGS. 21B to 21D as against FIGS. 18 to 20. This method of FIGS. 29A and 29B is also very effective.

FIG. 30 shows a configuration example of another part of the row decoder circuit in the semiconductor memory device according to a fifth embodiment of the present invention. The circuit shown in FIG. 30 has an addition of a voltage switching circuit 54E with respect to the circuit shown in FIG. 14 in configuration. That is, the NAND gate 57 has its first input terminal supplied with the row-address activating signal RDEC and its second through fourth input terminals supplied with the block address signals RA1, RA2, and RA3 respectively. At the output terminal of this NAND gate 57 is connected an input terminal of the inverter 58, so that an output signal in1 of this inverter 58 is supplied to the voltage switching circuits 54D and 54E. To the above-mentioned voltage switching circuit 54E is applied a voltage Vm as the operating power supply voltage. In addition, an output signal out1 of the above-mentioned voltage switching circuit 54E is applied to the voltage switching circuit 54D. The other circuit portions are the same as those of the circuit shown in FIG. 14 and so not detailed here, because the same elements are indicated by the same reference numerals.

FIGS. 31A to 31D are circuit diagrams for showing specific configuration examples of the voltage switching circuit 54E in the above-mentioned circuit shown in FIG. 30. In any of them, to the voltage switching circuit 54E is input the output signal in1 of the inverter 58, so that when this signal in1 is at the "high" level, 0V is output and, when the signal in1 is at the "low" level, the signal out1 of the Vm level is output.

A circuit shown in FIG. 31A comprises an inverter INVa, NMOS transistors QN13 and QN14, and PMOS transistors QP14 and QP15. The output signal in1 of the inverter 58 is supplied to the input terminal of the inverter INVa and the gates of the NMOS transistor QN14. To the output terminal of the inverter INVa is connected the gate of the NMOS transistor QN13. The sources of the NMOS transistors QN13 and QN14 are connected to the other power supply node, e.g. the ground point, while between their drains and the power supply node Vm are connected the drains and the sources of the PMOS transistors QN14 and QP15 respectively. The gate of the PMOS transistor QP14 is connected to the common-drain connection point between the PMOS transistor QP15 and the NMOS transistor QN14, while the gate of the PMOS transistor QP15 is connected to the common-drain connection point between the PMOS transistor QP14 and the NMOS transistor QN13. Accordingly, the output signal out1 obtained at the common-drain connection point between the transistors QP15 and QN14 is supplied to the input terminal of the voltage switching circuit 54D.

Furthermore, a circuit shown in FIG. 31B comprises an inverter INVb, NMOS transistors QN15 and QN16, PMOS transistors QP16 and QP17, and a depletion type NMOS transistor QD5. The output signal in1 of the inverter 58 is supplied to the input terminal of the inverter INVb and the gate of the NMOS transistor QN16. At an output terminal of the inverter INVb is connected the gate of the NMOS transistor QN15. The sources of the NMOS transistors QN15 and QN16 are commonly connected to the ground point and their drains are connected with the drains of the PMOS transistors QP16 and QP17 respectively. The gate of the PMOS transistor QP16 is connected to a common-drain connection point between the PMOS transistor QP16 and the NMOS transistor QN15. Between the sources of the PMOS transistors QN16 and QN17 and the voltage node Vm are connected the drain and the source of the depletion type NMOS transistor QD5, the gate of which is connected to a common-drain connection point between the transistors QP17 and QP16. The output signal out1 obtained at the common-drain connection point between the transistors QP17 and QP16 is supplied to the input terminal of the voltage switching circuit 54D.

A circuit shown in FIG. 31C comprises an NMOS transistor QN17, a PMOS transistor QP18, and a depletion type NMOS transistor QD16. The current paths of the transistors QN17, QP18, and QD6 are connected in series between the ground point and the voltage node Vm, so that the output signal in1 of the inverter 58 is supplied to the gates of the transistors QN17 and QP18. Furthermore, the gate of the transistor QD6 is connected to a common-drain connection point between the transistors QN17 and QP18. Accordingly, the output signal out1 obtained at the common-drain connection point between the transistors QN17 and QP18 is supplied to the input terminal of the voltage switching circuit 54D.

Further, a circuit shown in FIG. 31D comprises an inverter INVd, an NMOS transistor QN18, a PMOS transistor QP19, and a depletion type NMOS transistor QD7. The output signal in1 of the inverter 58 is supplied to the input terminal of the inverter INVd and the gate of the PMOS transistor QP19. At the output of the inverter INVd is connected one end of the current path of the NMOS transistor QN18, to the gate of which is applied the power supply voltage Vcc. Between the other end of the current path of the transistor QN18 and the voltage node Vm are connected in series the currents paths of the PMOS transistor QP19 and the depletion type NMOS transistor QD7. The gate of the transistor QD7 is connected to a connection point between the respective current paths of the transistors QN18 and QP19. Accordingly, the output signal out1 obtained at that connection point between the respective current paths of the transistors QN18 and QP19 is supplied to the input terminal of the voltage switching circuit 54D.

Note here that the above-mentioned voltage switching circuit 54D may employ a configuration of the voltage switching circuit 54A in the circuit shown in FIG. 7, the voltage switching circuit 54B in the circuit shown in FIG. 11, the voltage switching circuit in the circuit shown in FIG. 13, or that shown in FIGS. 22 to 25.

The voltage of the voltage node Vm in the circuit shown in FIG. 30 may be higher than, for example, the power supply voltage (or the power supply voltage of the NAND gate 57 or the inverter 58) and lower than the highest voltage of the power supply node VPPRW (which is usually equal to the programming high voltage Vpp in level). When the configuration shown in FIG. 30 is employed, a voltage level with either one of the two signals input to the voltage switching circuit 54D (which corresponds to the signal out1 in FIG. 30) as held at the "high" level has a high level from the power supply voltage to the voltage Vm. That is, in the row decoder circuit corresponding to a non-selected block, the output of the NAND gate 57 has a "high" level, so that the signal in1 output from the inverter 58 has a "low" level, thus resulting in the signal out1 having the Vm level. As a result, to the voltage switching circuit 54D is input the Vm-level signal.

Figure 32:
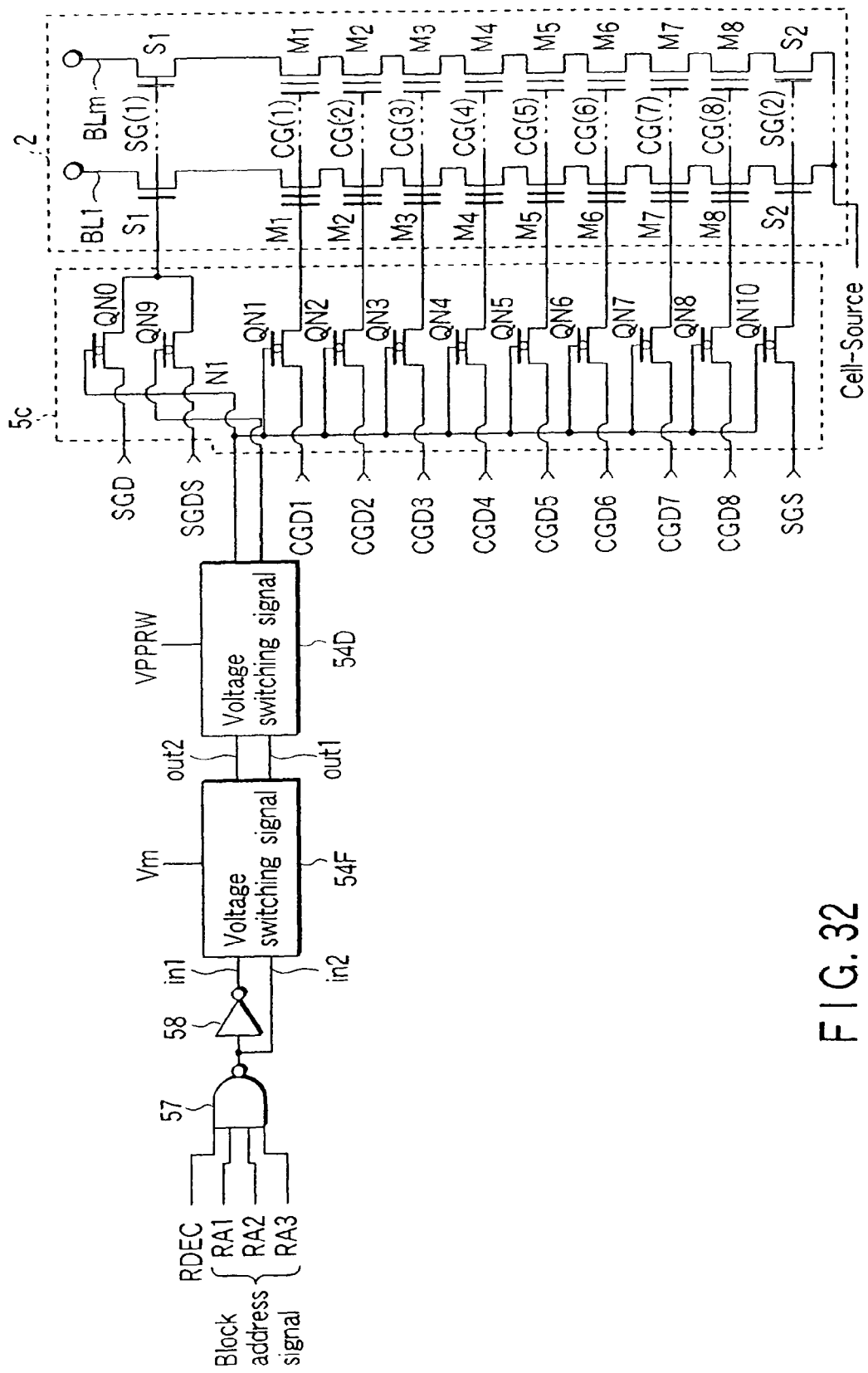
FIG. 32 is a circuit diagram for showing another configuration example of the row decoder in the semiconductor memory device according to a sixth embodiment of the present invention.

A special effect can be given to a case where such circuit as shown in FIG. 30 is employed by using the voltage switching circuit 54C in the circuit shown in FIG. 13 or such a circuit as shown in FIGS. 32 and 25 as the voltage switching circuit 54D.

The following will describe this effect with reference to a case where the voltage switching circuit 54C in the circuit shown in FIG. 13 is used as the above-mentioned voltage switching circuit 54D. If such a circuit configuration as shown in FIG. 30 is employed, in the row decoder corresponding to a non-selected block, the voltage applied to the gate of the transistor QP13 is raised from the power supply voltage to the Vm level, thus resulting in an advantage that the leakage current through the transistor QP13 can be reduced. The row decoder circuit is usually provided as many as about several millions to several tens of thousands on one chip, so that even if each row decoder circuit has a small leakage current, the chip as a whole has a large leakage current. Therefore, the circuit configuration shown in FIG. 30 provides a large effect in reduction of the leakage current. This effect can be obtained not only in the case where the voltage switching circuit in the circuit shown in FIG. 13 is applied to the voltage switching circuit 54D shown in FIG. 30 but also in a case where it is applied to the circuit configuration shown in FIGS. 23 and 25.

Besides, the circuit shown in FIGS. 31B to 31D employs therein the depletion type transistors QD5 to QD7. The highest value Vm of a voltage level applied to those transistors QD5 to QD7 is lower than the highest voltage level VPPRW (which is Vpp usually) applied to the depletion type NMOS transistors QD1 to QD4. Accordingly, the gate oxide film of the transistors WD5 to WD7 can be made thinner than that of the transistors QD1 to QD4. Accordingly, this provides a feature that as compared to a case of a thicker gate oxide film the transistors QD5 to QD7 can be reduced in area, because the lower the highest application voltage, the larger will a current flow through the transistors for each unit area caused by the thinner gate oxide film, thus resulting in reduction in the area occupied by the pattern of the transistors.

Likewise, the gate oxide film of the transistors QP14 to QP19 and QN13 to QN18 can be made thinner than that of the transistors QP11 to QP13 and QN13 to QN18. In this case, therefore, there is provided a feature that the area occupied by the pattern of the transistors can be made smaller than a case of a thinner gate oxide film.

Although the fifth embodiment has been described with reference to FIGS. 30 and 31A to 31D, the present invention may be changed in a variety of manners; for example, the present invention is applicable to such a circuit configuration as shown in FIGS. 32 and 33A to 33D.

FIG. 32 shows a configuration example of part of the row decoder circuit in the semiconductor memory device according to a sixth embodiment of the present invention. A circuit shown in FIG. 32 is provided to supply the output signal in1 of the inverter 58 and the output signal in2 of the NAND gate 57 in the above-mentioned circuit shown in FIG. 30 to a voltage switching circuit 54F and then supply the output signals out1 and out2 of this voltage switching circuit 54F to the voltage switching circuit 54D.

FIGS. 33A to 33D are circuit diagrams for showing specific configuration examples of the voltage switching circuit 54F in the above-mentioned circuit shown in FIG. 32. To this voltage switching circuit 54F are input the output signal in1 of the inverter 58 an the output signal in2 of the NAND gate 57, so that in the circuit shown in FIGS. 33A and 33B, when the signal in1 is at a "high" level (the signal in2 is at a "low" level) the signal out1 is set to 0V and the signal out2 is set to the Vm level, and when the signal in1 is at a "low" level (the signal in2 is at a "high" level) the signal out1 is set to the Vm level and the signal out2 is set to 0V. Moreover, in the circuit shown in FIGS. 33C and 33D, when the signal in1 is at a "high" level (the signal in2 is at a "low" level) the signal out1 is set to 0V and the signal out2 is set to the Vcc level, and when the signal in1 is at a "low" level (the signal in2 is at a "high" level) the signal out1 is set to the Vm level and the signal out2 is set to 0V.

A circuit shown in FIG. 33A comprises NMOS transistors QN13 and QN14 and PMOS transistors QP14 and QP15. The output signal in1 of the inverter 58 is supplied to the gate of the NMOS transistor QN14 and the output signal in2 of the NAND gate 57, to the gate of the NMOS transistor QN13. The sources of the NMOS transistors QN13 and QN14 are connected to the ground point and between their drains and the voltage node Vm are connected the drains and sources of the PMOS transistors QP14 and QP15. The gate of the PMOS transistor QP14 is connected to a common-drain connection point between the PMOS transistor QP15 and the NMOS transistor QN14 and the gate of the PMOS transistor QP15, to a common-drain connection point between the PMOS transistor QP14 and the NMOS transistor QN13. Accordingly, the output signal out1 obtained at the common-drain connection point between the transistors QP15 and QN14 and the output signal out2 obtained at the common-drain connection point between the transistors QP14 and QN13 are supplied to the respective input terminals of the voltage switching circuit 54D.

Furthermore, a circuit shown in FIG. 33B comprises NMOS transistors QN15 and QN16, PMOS transistors QP16 and QP17, and a depletion type NMOS transistor QD5. The output signal in1 of the inverter 58 is supplied to the gate of the NMOS transistor QN16 and the output signal in2 of the NAND gate 57, to the gate of the NMOS transistor QN15. The source of the NMOS transistors QN15 and QN16 are connected to the ground point and their drains are connected with the drains of the PMOS transistors QP16 and QP17 respectively. The gate of the PMOS transistor QP16 is connected to a common-drain connection point between the PMOS transistor QP17 and the NMOS transistor QN16 and the gate of the PMOS transistor QP17, to a common-drain connection point between the PMOS transistor QP16 and the NMOS transistor QN15. Between the sources of the PMOS transistors QP16 and QP17 and the voltage node Vm are connected the drain and source of the depletion type NMOS transistor QD5, the gate of which is connected to the common-drain connection point between the transistors QP17 and QN16. Accordingly, the output signal out1 obtained at the common-drain connection point between the transistors QP17 and QN16 and the output signal out2 obtained at the common-drain connection point between the transistors QP16 and QN15 are supplied to the respective input terminals of the voltage switching circuit 54D.

A circuit shown in FIG. 33C comprises an inverter INVe, an NMOS transistor QN17, a PMOS transistor QP18, and a depletion type NMOS transistor QD6. The current paths of the transistors QN17, QP18, and QD6 are connected in series between the ground point and the voltage node Vm, so that the output signal in1 of the inverter 58 is supplied to the gates of the transistors QN17 and QP18. Moreover, the gate of the transistor QD6 is connected to a common-drain connection point between the transistors QN17 and QP18. Further, the output signal in2 of the NAND gate 57 is supplied to the input terminal of the inverter INVe. Accordingly, the output signal out1 obtained at the common-drain connection point between the transistors QN17 and QP18 and the output signal out2 output from the output terminal of the inverter INVe are supplied to the respective input terminals of the voltage switching circuit 54D.

Further, a circuit shown n FIG. 33D comprises an inverter INVf, an NMOS transistor QN18, a PMOS transistor QP19, and a depletion type NMOS transistor QD7. The output signal in1 of the inverter 58 is supplied to the gate of the PMOS transistor QP19 and the output signal in2 of the NAND gate 57 is supplied to one end of the current path of the NMOS transistor QN18 and the input terminal of the inverter INVf. The power supply voltage Vcc is applied to the gate of the transistor QN18, between the other end of the current path of which and the voltage node Vm are connected in series the current paths of the PMOS transistor QP19 and the depletion type NMOS transistor QD7. The gate of the transistor QD7 is connected to a connection point between the current paths of the transistors QN18 and QP19. Accordingly, the output signal obtained at the common-drain connection point between the transistors QN18 and QP19 and the output signal out2 output from the output terminal of the inverter INVf are supplied to the respective input terminals of the voltage switching circuit 54D.

Such a circuit configuration as shown above in FIGS. 32 and 33A to 33D also has almost the same effect hence essentially the same actions and effects as those by the circuit configuration mentioned above with reference to FIGS. 30 and 31A to 31D.

Since, in such a circuit as shown in FIGS. 31A and 33A, the voltage VPPRW is applied to the n-well region, in which the PMOS transistors QP14 to QP19 are formed in the above-mentioned circuit shown in FIGS. 32 and 33A to 33D, commonly over a plurality of the relevant blocks, the above-mentioned configuration shown in FIG. 12A is suited. In such a configuration as shown in FIGS. 31B to 31D and 33B to 33D, on the other hand, the n-well voltage is not common, so that the configuration shown in FIGS. 12B, 18 to 20, 21A to 21E, 26 to 28, and 29A and 29B is suited.

Figure 34:
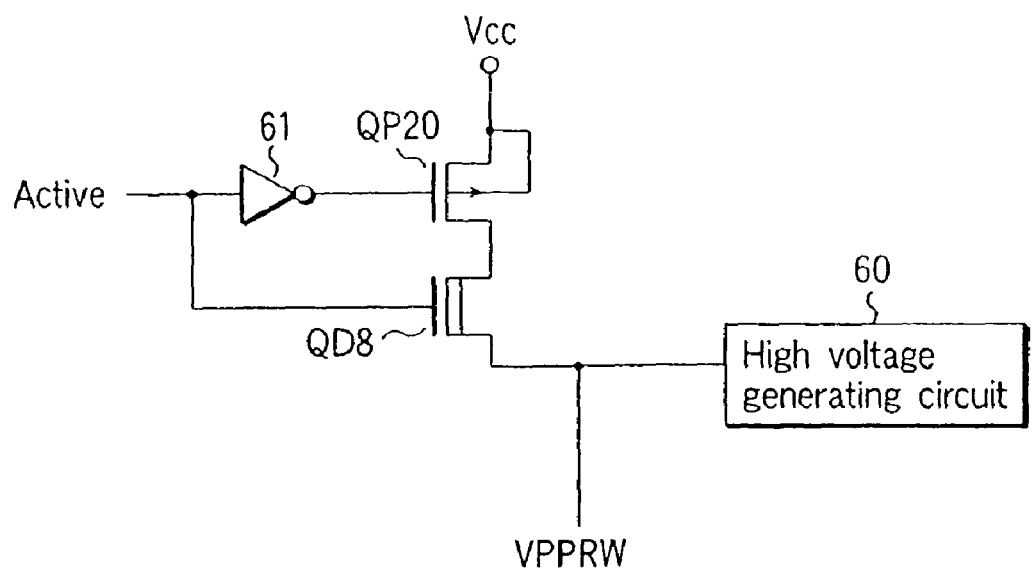
FIG. 34 is a circuit diagram for showing an extracted circuit portion for supplying a high voltage to the voltage switching circuit in the above-mentioned embodiments, intended to explain the semiconductor memory device according to another embodiment.
Figure 35:
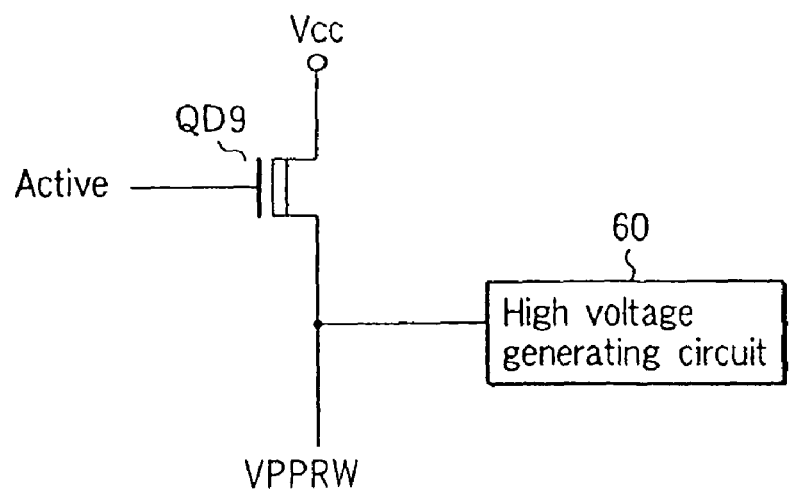
FIG. 35 is a circuit diagram for showing an extracted circuit portion for supplying a high voltage to the voltage switching circuit in the above-mentioned embodiments, intended to explain the semiconductor memory device according to further another embodiment.

FIGS. 34 and 35 are circuit diagrams for explaining the semiconductor memory device according to the other embodiments of the present invention, specifically showing an extracted circuit portion for supplying the voltage VPPRW to the voltage switching circuits 54 (54A to 54D) in the above-mentioned first through fifth embodiments. Those circuits are provided for switching the power supply node VPPRW between a stand-by state and an active state according to the Active signal.

That is, the circuit portion shown in FIG. 34 comprises a high-voltage generating circuit 60, an inverter 61, a PMOS transistor QP20, and a depletion type NMOS transistor QD8. At an output terminal of the above-mentioned high-voltage generating circuit 60 is connected the power supply node VPPRW of the voltage switching circuit 54, between which node VPPRW and the power supply voltage Vcc are connected in series the current paths of the transistors QD8 and QP20. The gate of the PMOS transistor QP20 is supplied with the Active signal via the inverter 61 and the gate of the depletion type NMOS transistor QD8, with the above-mentioned Active signal.

In the above-mentioned configuration, the Active signal is at 0V in the stand-by state and at Vcc in the active state and is generated on the basis of the Chip Enable signal input from, for example the /CE pin. Furthermore, the above-mentioned high-voltage generating circuit 60 is configured so as to be inoperative in the stand-by state.

Since the above-mentioned Active signal is at 0V in the stand-by state, the transistor QP20 is turned OFF and therefore the power supply node VPPRW enters a floating state. When the Active signal is set to Vcc in the active state, on the other hand, the transistor QP20 is turned ON and therefore the node VPPRW is charged up to the power supply voltage Vcc. Afterward, the high-voltage generating circuit 60 sets the node VPPRW to a high voltage and, at the same time, the Active signal is set to 0V, to thereby turn OFF the transistor QD8, thus releasing the power supply node VPPRW from the power supply Vcc.

Thus, it is possible to suppress the occurrence of a leakage current in the stand-by state and, in the active state (where speedy charge-up to Vcc is possible), accelerate the charging of the power supply node VPPRW to the high voltage.

The circuit portion shown in FIG. 35, on the other hand, comprises the high-voltage generating circuit 60 and a depletion type NMOS transistor QD9. At the output terminal of the high-voltage generating circuit 60 is connected the power supply node VPPRW of the voltage switching circuit 54, between which node VPPRW and the power supply Vcc is connected the current path of the transistor QD9. Accordingly, the gate of the above-mentioned depletion type NMOS transistor QD9 is supplied with the Active signal.

Such a configuration operates in almost the same manner as the above-mentioned circuit shown in FIG. 34 and gives almost the same actions and effects.

Although the present invention has been described with reference to the embodiments, the present invention is not limited to them but may be changed in various manners.

For example, although the above-mentioned embodiments of the present invention have been described in such an example that a voltage of 0V or higher is applied to a selected word line, the polarity may be reversed, that is, a voltage of 0V or lower may be applied to a selected word line, in which case the present invention is applicable in such a manner that the polarity is reversed, i.e. the NMOS transistor is changed to a PMOS one in the above-mentioned voltage switching circuit or, in this voltage switching circuit, the PMOS transistor is changed to an NMOS one and, at the same time, the transistor directly connected to the word line is changed from an NMOS type to a PMOS type.

Furthermore, although the above-mentioned embodiments of the present invention have been described in an example where the present invention is applied to the row decoder, any other configuration or connection relationship for voltage application may be used of the voltage switching circuit and the word line-connected transistors in the above-mentioned embodiments.

In addition, although the above-mentioned embodiments have been described in an example that eight memory cells are connected in series in each NAND cell, the number of these memory cells is not limited to eight but may be, for example, two, four, 16, 32, or 64, to which cases the present invention is also applicable. Moreover, the present invention is applicable to a case where only one memory cell is present with the select gate transistors. In addition, although the above-mentioned embodiments have been described in an example of a NAND cell-type EEPROM, the present invention is not limited to such a case but may be applicable also to such a case of any other devices, for example, NOR cell-type EEPROM, DINOR cell-type EEPROM, AND cell-type EEPROM, or NOR cell-type EEPROM provided with a select transistor.

FIG. 36 shows an equivalent circuit diagram of a memory cell array in a NOR cell-type EEPROM. This memory cell array includes NOR cells Mjo to Mj+2m at the intersections of word lines WLj, WLj+1, WLj+2, . . . and bit lines BL0, BL1, . . . , BLm respectively in such a configuration that the control gates of these NOR cells Mj0 to Mj+2m are connected to the word lines WLj, WLj+1, WLj+2, . . . in the rows and the drains are connected to the bit lines BL0, BL1, . . . , BLm in the columns respectively and the sources are commonly connected to the source line SL.

Figure 37:
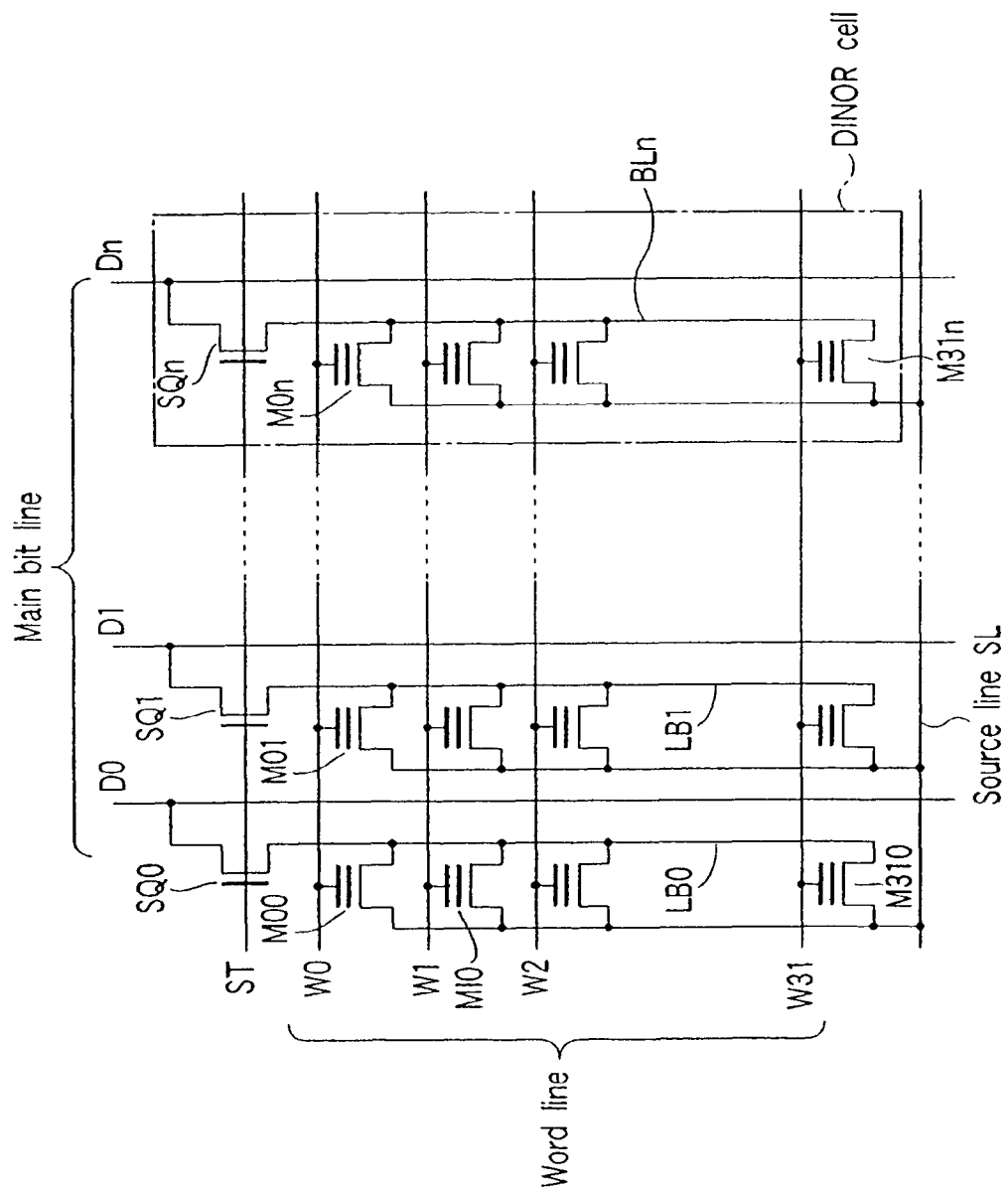
FIG. 37 is an equivalent circuit diagram for showing a memory cell array in a DINOR cell-type EEPROM.

Furthermore, FIG. 37 shows an equivalent circuit diagram of a memory cell array in a DINOR cell-type EEPROM. In the DINOR cell-type memory cell array, one DINOR cell is provided for each of the main bit lines D0, D1, . . . , Dn. Each DINOR cell comprises select gate transistors SQ0, SQ1, . . . , SQn and memory cells M00 to M31$n$ in such a configuration that the drains of these select gate transistors SQ0, SQ1, . . . , SQn are connected to the bit lines D0, D1, . . . , Dn respectively, the gates are commonly connected to the select gate line ST, and the sources are connected to the local bit lines LB0, LB1, . . . , LBn respectively. The drains of those memory cells M00 to M31n are connected to the local bit lines LB0, LB1, . . . , LBn in the rows, the control gates are connected to the word lines W0 to W31 in the columns, and the sources are commonly connected to the source line SL.

FIG. 38 shows an equivalent circuit diagram of the memory cell array in an AND cell-type EEPROM. In the AND cell-type memory array, one AND cell is provided for each of the main bit lines D0, D1, . . . , Dn. Each AND cell comprises first select gate transistors SQ10, SQ11, . . . , SQ1n, memory cells M00-M31n, and second select gate transistors SQ20, SQ21, . . . , SQ21n in such a configuration that the drains of these first select gate transistors SQ10, SQ11, . . . , SQ1n are connected to the main bit lines D0, D1, . . . , Dn respectively, the gates are commonly connected to the first select gate line ST1, and the sources are connected to the local bit lines LB0, LB1, . . . , LBn respectively. The drains of the memory cells M00 to M31n are connected to the local bit lines LB0, LB1, . . . , LBn in the rows respectively, the control gates are connected to the word lines W0 to W31 in the columns respectively, and the sources are connected to the local source lines LS0, LS1, . . . , LSn respectively. The drains of the second select gate transistors SQ20, SQ21, . . . , SQ2n are connected to the local source lines LS0, LS1, . . . , LSn respectively, the gates are connected to the second select gate line ST2, and the sources are commonly connected to the main source line MSL.

Figure 39:
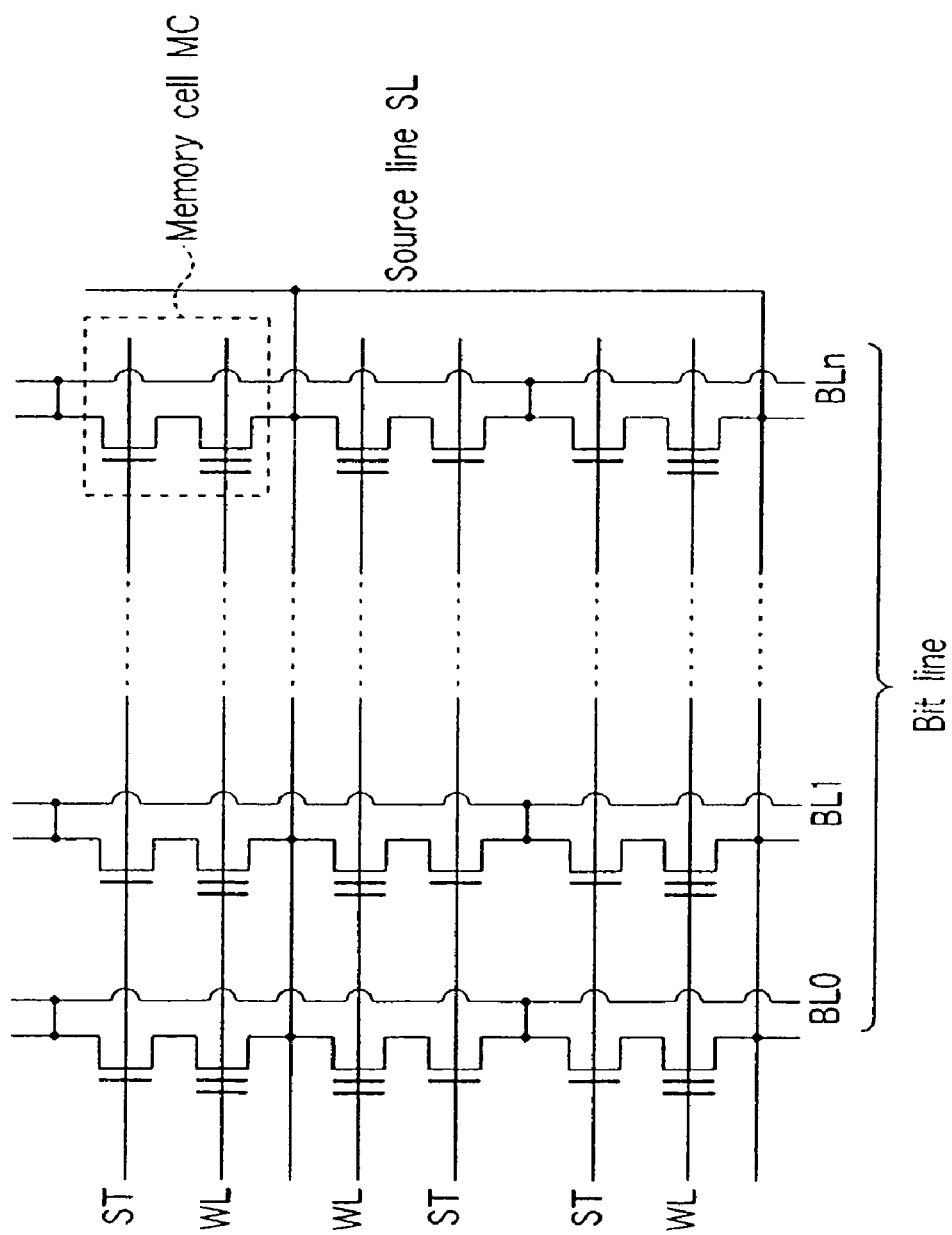
FIG. 39 is an equivalent circuit diagram for showing a memory cell array in a NOR cell-type EEPROM provided with a selection transistor.

Further, FIG. 39 shows an equivalent circuit diagram of the memory cell array in a NOR cell-type EEPROM provided with a select transistor. In this memory cell array, a plurality of memory cells MC each comprising a select transistor SQ and a memory cell transistor M is arranged in a matrix. The drains of all the select transistors SQ in each column are connected to each of bit lines BL0, BL1, . . . , BLn, the gates thereof in each row are connected to each of the select gate lines ST, and the sources thereof are connected to the drains of the corresponding memory cell transistors M. The control gates of all the memory cell transistors M in each row are connected to each of the word lines WL and the sources thereof are commonly connected to the source line SL.

For details of the DINOR cell-type EEPROM, see "H. Onoda et al., IEDM Tech. Digest, 1992, pp. 599-602" and for details of the above-mentioned AND cell-type EEPROM, see "H. Kume et al., IEDM Tech. Digest, 1992, pp 991-993".

Although the embodiments of the present invention have been described with reference to an example of a nonvolatile memory device capable of electrical rewriting, the present invention is applicable also to other types of devices, e.g., other types of nonvolatile memory devices, DRAMs, SRAMs, etc.

Although the present invention has been described with reference to its embodiments, the present invention is not limited to them but may be changed in a variety of manners within the gist thereof. Further, the above-mentioned embodiments include a variety of steps of the present invention, so that by appropriately combining some of the plurality of disclosed component requirements, a variety of inventions can be extracted. For example, even if some of all the component requirements disclosed in the embodiments are deleted, at least one of the above-mentioned problems to be solved by the present invention can be solved, so that a configuration given as a result of this deletion can be extracted as far as at least one of the above-mentioned effects is obtained.

As mentioned above, by the present invention, it is possible to internally provide a row decoder with a voltage switching circuit including PMOS transistors to thereby set the gate of each NMOS transistor to a high voltage without providing a pump circuit, even in a case where only one NMOS transistor is connected to each word line in the row decoder circuit.

Therefore, it is possible to apply a high voltage to the word line without a potential drop and also to obtain a semiconductor memory device having a reduced area of the pattern of the row decoder circuit.

Furthermore, it is possible to realize the row decoder circuit having such a small pattern area, thus obtaining a semiconductor memory device capable of realizing an inexpensive and highly reliable chip.

Further, it is possible to apply a high voltage to the word line without a potential drop, thus obtaining a semiconductor memory device capable of realizing an appropriate data programming operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
at least one memory cell array in which memory cell units are arranged in a matrix, the memory cell units each having a plurality of memory cells connected in series, a first select gate transistor and a second select gate transistor, the plurality of memory cells being connected between the first select gate transistor and the second select gate transistor in each of the memory cell units, and the memory cell array including a plurality of word lines and a plurality of bit lines;
a first word line;
a second word line;
a third word line;
a fourth word line;
a first plurality of word lines being connected to a first memory cell unit, the first plurality of word lines including both the first word line and the third word line;
a second plurality of word lines being connected to a second memory cell unit, the second plurality of word lines including both the second word line and the fourth word line;
a third plurality of word lines being connected to a third memory cell unit;
a first transistor of a first conductivity type, a source or a drain of the first transistor being connected to the first word line;
a second transistor of the first conductivity type, a source or a drain of the second transistor being connected to the second word line;
a third transistor of the first conductivity type, a source or a drain of the third transistor being connected to the third word line;
a fourth transistor of the first conductivity type, a source or a drain of the fourth transistor being connected to the fourth word line;
a fifth transistor of a second conductivity type opposite to the first conductivity type, a drain of the fifth transistor being connected to both a gate of the first transistor and a gate of the third transistor;

a sixth transistor of the first conductivity type, a source of the fifth transistor being connected to a source of the sixth transistor, a gate of sixth transistor being connected to both the gate of the first transistor and the gate of the third transistor;

a plurality of row decoder circuits comprising the first transistor, the second transistor, the third transistor, the fourth transistor, the fifth transistor and the sixth transistor, one of the plurality of row decoder circuits selecting one of the plurality of word lines and applying voltages to word lines including a selected word line connected to a selected memory cell included in a selected memory cell unit; and a first well region of the first conductivity type, the fifth transistor being formed in the first well region, wherein the first memory cell unit and the third memory cell unit are included in the same memory cell array, wherein a first voltage is applied to the first well region in a first operation when the selected word line is included in the first plurality of word lines and the selected word line is not included in the second plurality of word lines and the third plurality of word lines, wherein the first voltage is applied to the first well region in the first operation when the selected word line is included in the second plurality of word lines and the selected word line is not included in the first plurality of word lines and the third plurality of word lines, wherein a second voltage is applied to the first well region in the first operation when the selected word line is included in the third plurality of word lines and the selected word line is not included in the first plurality of word lines and the second plurality of word lines, and wherein the first voltage and the second voltage are different from each other.

2. The semiconductor memory device according to claim 1, wherein the first voltage is higher than the second voltage.

3. The semiconductor memory device according to claim 1, further comprising:

a second well region of the first conductivity type; and a seventh transistor of the second conductivity type, wherein the seventh transistor is formed in the first well region, the seventh transistor is included in the plurality of row decoder circuits, and the second well region is separated from the first well region, wherein the first voltage is applied to the second well region in the first operation when the selected word line is included in the third plurality of word lines and the selected word line is not included in the first plurality of word lines and the second plurality of word lines, and wherein the second voltage is applied to the first well region in the first operation when the selected word line is included in the first plurality of word lines or the second plurality of word lines and the selected word line is not included in the third plurality of word lines.

4. The semiconductor memory device according to claim 3, wherein the first voltage is higher than the second voltage.

5. The semiconductor memory device according to claim 1, wherein the first memory cell unit, the second memory cell unit and the third memory cell unit are included in the same memory cell array.

6. The semiconductor memory device according to claim 1, wherein the first, second, third, fourth and sixth transistors are n-channel transistors, and the fifth transistor is a p-channel transistor.

7. The semiconductor memory device according to claim 1, wherein a transistor connected to the first word line is only the first transistor, a transistor connected to the second word line is only the second transistor, a transistor connected to the third word line is only the third transistor, and a transistor connected to the fourth word line is only the fourth transistor.

8. The semiconductor memory device according to claim 1, wherein a third voltage is applied to a gate of the fifth transistor in the first operation when the selected word line is included in the first plurality of word lines, the third voltage is lower than power supply voltage, and the fifth transistor turns on as long as the third voltage is applied to the gate of the fifth transistor.

9. The semiconductor memory device according to claim 8, wherein a fourth voltage is applied to the gate of the fifth transistor in the first operation when the selected word line is included in the third plurality of word lines, the fifth transistor turns off as long as the fourth voltage is applied to the gate of the fifth transistor, and the third voltage is lower than the fourth voltage.

10. The semiconductor memory device according to claim 1, further comprising:

a seventh transistor of the first conductivity type, a drain of the seventh transistor being connected to the drain of the fifth transistor.

11. The semiconductor memory device according to claim 10, wherein a third voltage is applied to a source of the seventh transistor in the first operation when the selected word line is included in the first plurality of word lines, a fourth voltage is applied to the source of the seventh transistor in the first operation when the selected word line is included in the third plurality of word lines, and the third voltage is higher than the fourth voltage.

12. The semiconductor memory device according to claim 1, further comprising:

a seventh transistor of the first conductivity type, a drain of the seventh transistor being connected to the drain of the fifth transistor, wherein a third voltage is applied to a gate of the seventh transistor in the first operation when the selected word line is included in the first plurality of word lines, the third voltage is lower than power supply voltage, a fourth voltage is applied to the gate of the seventh transistor in the first operation when the selected word line is included in the third plurality of word lines, and the third voltage is lower than the fourth voltage.

13. The semiconductor memory device according to claim 12, wherein a source of the seventh transistor is connected to 0V.

14. The semiconductor memory device according to claim 10, further comprising:

an eighth transistor of the first conductivity type, a drain of the eighth transistor being connected to a source of the seventh transistor.

15. The semiconductor memory device according to claim 14, wherein a third voltage is applied to a source of the eighth transistor in the first operation when the selected word line is included in the first plurality of word lines, a fourth voltage is applied to the source of the eighth transistor in the first operation when the selected word line is included in the third plurality of word lines, and the third voltage is higher than the fourth voltage.

16. The semiconductor memory device according to claim 1, wherein the memory cells are nonvolatile memory cells.

17. The semiconductor memory device according to claim 1, wherein the first select gate transistor is connected between one of the plurality of bit lines and one end of the plurality of memory cells.

18. The semiconductor memory device according to claim 17, wherein the second select gate transistor is connected between a source line and the other end of the plurality of memory cells.

19. A semiconductor memory device comprising:
at least one memory cell array in which memory cell units are arranged in a matrix, the memory cell units each having a plurality of memory cells connected in series, a first select gate transistor and a second select gate transistor, the plurality of memory cells being connected between the first select gate transistor and the second select gate transistor in each of the memory cell units, and the memory cell array including a plurality of word lines and a plurality of bit lines;
a plurality of blocks, each of the blocks including the memory cell units connected to the plurality of word lines;
a first word line;
a second word line;
a third word line;
a fourth word line;
a first block including a first memory cell unit connected to a first plurality of word lines, the first plurality of word lines including both the first word line and the third word line;
a second block including a second memory cell unit connected to a second plurality of word lines, the second plurality of word lines including both the second word line and the fourth word line;
a third block including a third memory cell unit connected to a third plurality of word lines;
a first transistor of a first conductivity type, a source or a drain of the first transistor being connected to the first word line;
a second transistor of the first conductivity type, a source or a drain of the second transistor being connected to the second word line;
a third transistor of the first conductivity type, a source or a drain of the third transistor being connected to the third word line;
a fourth transistor of the first conductivity type, a source or a drain of the fourth transistor being connected to the fourth word line;
a fifth transistor of a second conductivity type opposite to the first conductivity type, a drain of the fifth transistor being connected to both a gate of the first transistor and a gate of the third transistor;
a sixth transistor of the first conductivity type, a source of the fifth transistor being connected to a source of the sixth transistor, a gate of sixth transistor being connected to both the gate of the first transistor and the gate of the third transistor; and
a plurality of row decoder circuits comprising the first transistor, the second transistor, the third transistor, the fourth transistor, the fifth transistor and the sixth transistor, one of the plurality of row decoder circuits selecting one of the plurality of word lines and applying voltages to word lines connected to a selected memory cell unit included in a selected block, the selected memory cell unit including a selected memory cell connected to a selected word line; and
a first well region of the first conductivity type, the fifth transistor being formed in the first well region,
wherein the first memory cell unit and the third memory cell unit are included in the same memory cell array,
wherein a first voltage is applied to the first well region in a first operation when the selected word line is included in the first plurality of word lines and the selected word line is not included in the second plurality of word lines and the third plurality of word lines,
wherein the first voltage is applied to the first well region in the first operation when the selected word line is included in the second plurality of word lines and the selected word line is not included in the first plurality of word lines and the third plurality of word lines,
wherein a second voltage is applied to the first well region in the first operation when the selected word line is included in the third plurality of word lines and the selected word line is not included in the first plurality of word lines and the second plurality of word lines, and
wherein the first voltage and the second voltage are different from each other.

20. The semiconductor memory device according to claim 19, wherein the first voltage is higher than the second voltage.

21. The semiconductor memory device according to claim 19, further comprising:
a second well region of the first conductivity type; and
a seventh transistor of the second conductivity type,
wherein the seventh transistor is formed in the first well region, the seventh transistor is included in the plurality of row decoder circuits, and the second well region is separated from the first well region,
wherein the first voltage is applied to the second well region in the first operation when the selected word line is included in the third plurality of word lines and the selected word line is not included in the first plurality of word lines and the second plurality of word lines, and
wherein the second voltage is applied to the first well region in the first operation when the selected word line is included in the first plurality of word lines or the second plurality of word lines and the selected word line is not included in the third plurality of word lines, and the first voltage is higher than the second voltage.

22. The semiconductor memory device according to claim 19, wherein the first memory cell unit, the second memory cell unit and the third memory cell unit are included in the same memory cell array.

23. The semiconductor memory device according to claim 19, wherein a third voltage is applied to a gate of the fifth transistor in the first operation when the selected word line is included in the first plurality of word lines, the third voltage is lower than power supply voltage, and the fifth transistor turns on as long as the third voltage is applied to the gate of the fifth transistor.

24. The semiconductor memory device according to claim 23, wherein a fourth voltage is applied to the gate of the fifth transistor in the first operation when the selected word line is included in the third plurality of word lines, the fifth transistor turns off as long as the fourth voltage is applied to the gate of the fifth transistor, and the third voltage is lower than the fourth voltage.

25. A semiconductor memory device comprising:
at least one memory cell array in which memory cell units are arranged in a matrix, the memory cell units each having a plurality of memory cells, the memory cell array including a plurality of word lines and a plurality of bit lines;
a plurality of blocks, each of the blocks including the memory cell units connected to the plurality of word lines;
a first word line;
a second word line;
a third word line;
a fourth word line;

a first block including a first memory cell unit connected to a first plurality of word lines, the first plurality of word lines including both the first word line and the third word line;

a second block including a second memory cell unit connected to a second plurality of word lines, the second plurality of word lines including both the second word line and the fourth word line;

a third block including a third memory cell unit connected to a third plurality of word lines;

a first transistor of a first conductivity type, a source or a drain of the first transistor being connected to the first word line;

a second transistor of the first conductivity type, a source or a drain of the second transistor being connected to the second word line;

a third transistor of the first conductivity type, a source or a drain of the third transistor being connected to the third word line;

a fourth transistor of the first conductivity type, a source or a drain of the fourth transistor being connected to the fourth word line;

a fifth transistor of a second conductivity type opposite to the first conductivity type, a drain of the fifth transistor being connected to both a gate of the first transistor and a gate of the third transistor;

a sixth transistor of the first conductivity type, a source of the fifth transistor being connected to a source of the sixth transistor, and a gate of sixth transistor being connected to both the gate of the first transistor and the gate of the third transistor;

a plurality of row decoder circuits comprising the first transistor, the second transistor, the third transistor, the fourth transistor, the fifth transistor and the sixth transistor, one of the plurality of row decoder circuits selecting one of the plurality of word lines and applying voltages to word lines connected to a selected memory cell unit included in a selected block, the selected memory cell unit including a selected memory cell connected to a selected word line; and a first well region of the first conductivity type, the fifth transistor being formed in the first well region, wherein the first memory cell unit and the third memory cell unit are included in the same memory cell array, wherein a first voltage is applied to the first well region in a first operation when the selected word line is included in the first plurality of word lines and the selected word line is not included in the second plurality of word lines and the third plurality of word lines, wherein the first voltage is applied to the first well region in the first operation when the selected word line is included in the second plurality of word lines and the selected word line is not included in the first plurality of word lines and the third plurality of word lines, wherein a second voltage is applied to the first well region in the first operation when the selected word line is included in the third plurality of word lines and the selected word line is not included in the first plurality of word lines and the second plurality of word lines, and wherein the first voltage and the second voltage are different from each other.

26. The semiconductor memory device according to claim 25, wherein the first voltage is higher than the second voltage.

27. The semiconductor memory device according to claim 25, further comprising:

a second well region of the first conductivity type; and a seventh transistor of the second conductivity type, wherein the seventh transistor is formed in the first well region, the seventh transistor is included in the plurality of row decoder circuits, and the second well region is separated from the first well region, wherein the first voltage is applied to the second well region in the first operation when the selected word line is included in the third plurality of word lines and the selected word line is not included in the first plurality of word lines and the second plurality of word lines, and wherein the second voltage is applied to the first well region in the first operation when the selected word line is included in the first plurality of word lines or the second plurality of word lines and the selected word line is not included in the third plurality of word lines, and the first voltage is higher than the second voltage.

28. The semiconductor memory device according to claim 25, wherein the first memory cell unit, the second memory cell unit and the third memory cell unit are included in the same memory cell array.

29. The semiconductor memory device according to claim 25, wherein a third voltage is applied to a gate of the fifth transistor in the first operation when the selected word line is included in the first plurality of word lines, the third voltage is lower than power supply voltage, and the fifth transistor turns on as long as the third voltage is applied to the gate of the fifth transistor.

30. The semiconductor memory device according to claim 29, wherein a fourth voltage is applied to the gate of the fifth transistor in the first operation when the selected word line is included in the third plurality of word lines, the fifth transistor turns off as long as the fourth voltage is applied to the gate of the fifth transistor, and the third voltage is lower than the fourth voltage.

* * * * *